United States Patent
Adachi et al.

(10) Patent No.: US 9,904,169 B2
(45) Date of Patent: *Feb. 27, 2018

(54) PHOTOMASK BLANK, RESIST PATTERN FORMING PROCESS, AND METHOD FOR MAKING PHOTOMASK

(71) Applicant: Shin-Etsu Chemical Co., Ltd., Tokyo (JP)

(72) Inventors: Teppei Adachi, Joetsu (JP); Satoshi Watanabe, Joetsu (JP); Daisuke Domon, Joetsu (JP); Keiichi Masunaga, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/089,788

(22) Filed: Apr. 4, 2016

(65) Prior Publication Data

US 2016/0299431 A1  Oct. 13, 2016

(30) Foreign Application Priority Data

Apr. 7, 2015 (JP) ................. 2015-078459

(51) Int. Cl.
| | | |
|---|---|---|
| *G03F 7/038* | (2006.01) | |
| *G03F 7/09* | (2006.01) | |
| *G03F 7/11* | (2006.01) | |
| *G03F 1/50* | (2012.01) | |
| *G03F 7/004* | (2006.01) | |
| *G03F 7/20* | (2006.01) | |
| *G03F 7/32* | (2006.01) | |
| *G03F 7/36* | (2006.01) | |
| *G03F 7/40* | (2006.01) | |
| *G03F 1/80* | (2012.01) | |
| *G03F 7/039* | (2006.01) | |

(52) U.S. Cl.
CPC .............. *G03F 7/0382* (2013.01); *G03F 1/50* (2013.01); *G03F 1/80* (2013.01); *G03F 7/0045* (2013.01); *G03F 7/0046* (2013.01); *G03F 7/039* (2013.01); *G03F 7/09* (2013.01); *G03F 7/093* (2013.01); *G03F 7/11* (2013.01); *G03F 7/2059* (2013.01); *G03F 7/322* (2013.01); *G03F 7/36* (2013.01); *G03F 7/40* (2013.01); *G03F 7/405* (2013.01)

(58) Field of Classification Search
None
See application file for complete search history.

(56) References Cited

U.S. PATENT DOCUMENTS

| | | | |
|---|---|---|---|
| 7,531,287 B2 | 5/2009 | Kanda et al. | |
| 8,343,694 B2 | 1/2013 | Koitabashi et al. | |
| 2007/0111140 A1* | 5/2007 | Hatakeyama | G03F 7/0045 430/270.1 |
| 2012/0219887 A1* | 8/2012 | Masunaga | G03F 7/0045 430/5 |
| 2013/0209922 A1* | 8/2013 | Masunaga | G03F 7/0382 430/5 |
| 2016/0091792 A1* | 3/2016 | Nagasawa | G03F 7/093 428/195.1 |
| 2016/0299428 A1* | 10/2016 | Masunaga | G03F 1/20 |
| 2017/0351176 A1 | 12/2017 | Yamaguchi et al. | |

FOREIGN PATENT DOCUMENTS

| | | |
|---|---|---|
| EP | 1 621 927 A2 | 2/2006 |
| EP | 2 000 851 A1 | 12/2008 |
| EP | 2256551 A1 | 12/2010 |
| EP | 2362267 A1 | 8/2011 |
| EP | 2492746 A2 | 8/2012 |
| JP | 2002-226721 A | 8/2002 |
| JP | 2006-48029 A | 2/2006 |
| JP | 2008-203452 A | 9/2008 |
| JP | 2008-304590 A | 12/2008 |
| JP | 2015-38744 A | 2/2015 |
| WO | 2016/136563 A1 | 9/2016 |

OTHER PUBLICATIONS

European Search Report dated Sep. 9, 2016 issued in corresponding European Patent Application No. 16161526.5, 6 pages.
Office Action dated Dec. 12, 2017, issued in counterpart Japanese Application No. 2015-078459, with English machine transaltion. (4 pages).

* cited by examiner

*Primary Examiner* — Sin Lee
(74) *Attorney, Agent, or Firm* — Westerman, Hattori, Daniels & Adrian, LLP

(57) ABSTRACT

A photomask blank has a chemically amplified negative resist film comprising (A) a polymer comprising recurring units of specific structure and recurring units having fluorine, (B) a base resin adapted to reduce its solubility in alkaline developer under the action of acid, (C) an acid generator, and (D) a basic compound. The resist film is improved in receptivity to antistatic film.

13 Claims, No Drawings

PHOTOMASK BLANK, RESIST PATTERN FORMING PROCESS, AND METHOD FOR MAKING PHOTOMASK

CROSS-REFERENCE TO RELATED APPLICATION

This non-provisional application claims priority under U.S.C. § 119(a) on Patent Application No. 2015-078459 filed in Japan on Apr. 7, 2015, the entire contents of which are hereby incorporated by reference.

TECHNICAL FIELD

This invention relates to a photomask blank having a chemically amplified negative resist film, a process for forming a resist pattern, and a method for preparing a photomask from the photomask blank.

BACKGROUND ART

The recent trend toward higher integration in the integrated circuit technology poses a demand for finer feature size patterns. In processing of patterns with a size of less than 0.2 µm, acid-catalyzed chemically amplified resist compositions are used in most cases. The light source for exposure in the processing is high-energy radiation including UV, deep UV, electron beam (EB), X-ray, excimer laser, γ-ray, and synchrotron radiation. Among others, the EB lithography is utilized as the ultrafine processing technology and in particular, indispensable as the process for forming a pattern on a photomask which becomes an original image for pattern exposure.

The photomask resulting from EB writing offers an original image for the fabrication of semiconductor devices. For mask pattern formation, the accuracy of EB writing position and the accurate control of pattern line width are critical.

One of problems inherent to the EB lithography is the charge-up phenomenon that electric charges accumulate on or in the resist film during exposure. The charge causes the path of incident EB to be deflected, substantially detracting from the accuracy of mask pattern writing. The phenomenon may be avoided by coating an antistatic film on the resist film so that the charge may be released. The antistatic means is indispensable for writing fine size patterns.

However, another problem arises when an antistatic film is coated on a chemically amplified resist film. The acid in the antistatic film diffuses into the resist film, whereby noticeable changes of line width, shape and sensitivity occur after exposure. Also, the acid generated in the resist film by exposure is neutralized with a certain component in the antistatic film, whereby changes of line width and sensitivity similarly occur, failing in accurate writing.

Since the resist film is hydrophobic on its surface, it has no affinity to aqueous antistatic agents. It is thus difficult to coat the antistatic agent onto the resist film. As a solution to this problem, JP-A 2002-226721 proposes to add a surfactant to facilitate coating operation. This is still unsatisfactory in that some surfactants have detrimental impacts such as intermixing with the resist film surface.

On the other hand, JP-A 2006-048029, for example, discloses that a fluorinated polymer, when used in a resist composition subject to the immersion lithography, is effective for preventing any components in the resist film from being leached out from its surface. The immersion lithography intends to acquire high resolution performance by increasing the incident angle of light, and is a technique of repeatedly transferring the pattern of the photomask as the original to a resist film on a recipient such as wafer.

The immersion lithography is not applicable when a photomask is prepared from a photomask blank by scanning the resist film on the blank directly with a beam of high-energy radiation. Therefore, the fluorinated polymers are not used in the resist material for photomask blanks. JP-A 2008-304590 discloses that a polymer comprising recurring units having fluorine atoms is added to a resist material for photomask blanks to improve resist performance. Even when such a fluorinated polymer is used, the coating of an antistatic film is still inefficient. It is then difficult to meet all factors including resolution and age stability of a resist film and effective coating of an antistatic film.

CITATION LIST

Patent Document 1: JP-A 2002-226721
Patent Document 2: JP-A 2006-048029 (U.S. Pat. No. 7,531,287, EP 1621927)
Patent Document 3: JP-A 2008-304590 (U.S. Pat. No. 8,343,694, EP 2000851)

DISCLOSURE OF INVENTION

In conjunction with the process for forming a resist pattern by lithography, especially EB lithography, requiring high-accuracy formation of a fine size pattern, an object of the invention is to provide a photomask blank having a chemically amplified negative resist film which meets the requirements of resolution and age stability of the resist film and effective coating of an antistatic film thereon; a process for forming a resist pattern on the photomask blank; and a method for preparing a photomask from the photomask blank.

The inventors have found that when a polymer comprising recurring units having a specific substituent group on aromatic ring and recurring units having at least one fluorine atom is added to a resist film, the resist film is improved in age stability and antistatic film-receptivity without sacrificing resolution.

In one aspect, the invention provides a photomask blank comprising a chemically amplified negative resist film adapted for exposure to high-energy radiation, the resist film comprising (A) a polymer comprising recurring units represented by the general formula (1) and recurring units having at least one fluorine atom, (B) a base resin adapted to reduce its solubility in alkaline developer under the action of acid, (C) an acid generator, and (D) a basic compound.

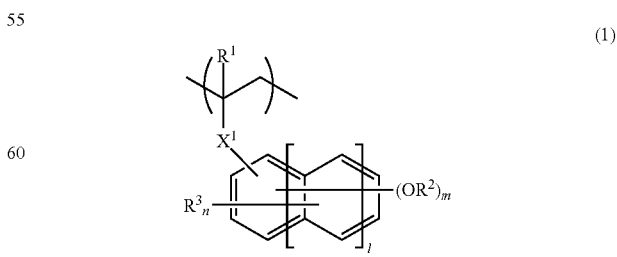

Herein $R^1$ is hydrogen or methyl, $R^2$ is hydrogen or a straight or branched $C_1$-$C_5$ monovalent hydrocarbon group in which at least one of carbon-bonded hydrogen atoms may be substituted by hydroxyl, or in which a heteroatom selected from oxygen, sulfur and nitrogen may intervene in a carbon-carbon bond, $R^3$ is a straight or branched $C_1$-$C_5$ monovalent hydrocarbon group in which at least one of carbon-bonded hydrogen atoms may be substituted by hydroxyl, or in which a heteroatom selected from oxygen, sulfur and nitrogen may intervene in a carbon-carbon bond, m is an integer of 1 to 3, n is an integer satisfying 0≤n≤5+2l−m, l is 0 or 1, and $X^1$ is a single bond, —C(=O)O— or —C(=O)NH—.

The photomask blank having the resist film has an advantage that an antistatic film is effectively coated on the resist film. When a photomask is prepared from the photomask blank by depositing an antistatic film on the resist film and directly scanning the resist film with a beam of high-energy radiation, the mask pattern can be formed at a high accuracy. As compared with a photomask blank having a resist film free of the polymer (A), the photomask blank of the invention is effective for preventing penetration of the acid and migration of any acid-neutralizing component from the antistatic film into the resist film. As a result, the age stability of the resist film after coating of the antistatic film is drastically improved.

In a preferred embodiment, the recurring units having at least one fluorine atom in the polymer (A) are units of at least one type selected from units having the general formulae (2) to (7). Inclusion of these recurring units allows the polymer (A) to segregate on the resist film surface without sacrificing the resolution of the resist film.

(2)

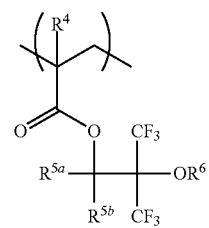

(3)

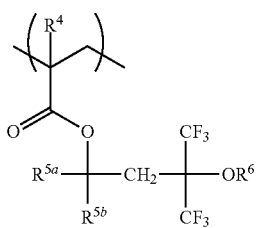

(4)

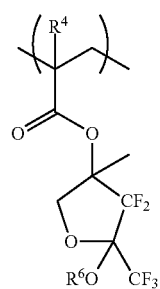

(5)

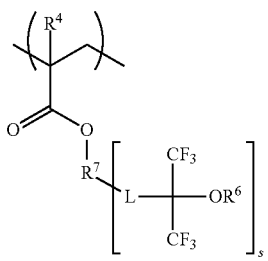

(6)

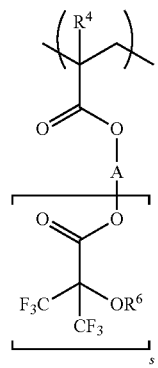

(7)

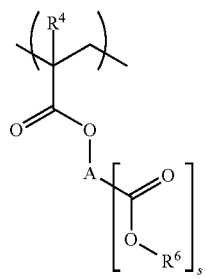

Herein $R^4$ is each independently hydrogen, fluorine, methyl or trifluoromethyl, $R^{5a}$ and $R^{5b}$ are each independently hydrogen or a straight, branched or cyclic $C_1$-$C_{10}$ alkyl group, $R^6$ is each independently hydrogen, a straight, branched or cyclic $C_1$-$C_{15}$ monovalent hydrocarbon or fluorinated hydrocarbon group, or an acid labile group, with the proviso that in the monovalent hydrocarbon or fluorinated hydrocarbon group represented by $R^6$, an ether bond (—O—) or carbonyl moiety (—C(=O)—) may intervene in a carbon-carbon bond, $R^7$ is a (s+1)-valent, cyclic $C_3$-$C_{20}$ hydrocarbon or fluorinated hydrocarbon group, L is a single bond or an optionally substituted divalent linking group, A is each independently a (s+1)-valent, straight, branched or cyclic $C_1$-$C_{20}$ hydrocarbon or fluorinated hydrocarbon group, with the proviso that at least one of $R^6$ and A in formula (7) contains fluorine, and s is each independently an integer of 1 to 3.

Preferably the photomask blank may further comprise an antistatic film on the resist film. The antistatic film prevents the charge-up phenomenon during EB writing, whereby the accuracy of writing position is drastically improved.

The antistatic film may comprise an amino acid. The preferred amino acid has the formula (8), but is not limited thereto. The addition of amino acid is effective for suppressing acid diffusion between the resist film and the antistatic film, further mitigating the impact of acid.

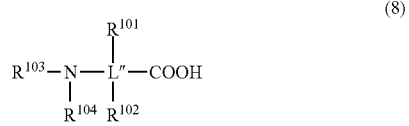

(8)

Herein $R^{101}$ and $R^{102}$ are each independently hydrogen or a straight, branched or cyclic $C_1$-$C_{20}$ monovalent hydrocarbon group which may be separated by a heteroatom, $R^{103}$ and $R^{104}$ are each independently hydrogen or a straight, branched or cyclic $C_1$-$C_{20}$ monovalent hydrocarbon group which may be separated by a heteroatom, or a pair of $R^{101}$ and $R^{103}$ or $R^{101}$ and $R^{104}$ may bond together to form a ring with the carbon and nitrogen atoms to which they are attached, and L″ is a straight, branched or cyclic $C_1$-$C_{20}$ divalent hydrocarbon group which may be separated by a heteroatom.

In a preferred embodiment, the base resin (B) comprises recurring units having the general formula (UN-1).

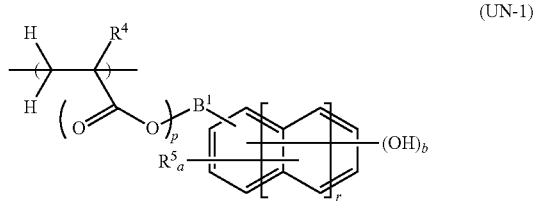

(UN-1)

Herein $R^4$ is hydrogen, fluorine, methyl or trifluoromethyl, $R^5$ is each independently hydrogen or a $C_1$-$C_6$ alkyl group, $B^1$ is a single bond or a $C_1$-$C_{10}$ alkylene group which may contain an ether bond, p is 0 or 1, r is an integer of 0 to 2, a is an integer satisfying a≤5+2r−b, and b is an integer of 1 to 5.

When the base resin (B) comprises recurring units of formula (UN-1), the resist film is given etch resistance, is able to adjust the solubility in alkaline developer, and becomes more adherent to any underlying substrate.

In a more preferred embodiment, the base resin (B) comprises recurring units of at least one type selected from units having the general formulae (UN-2) and (UN-3).

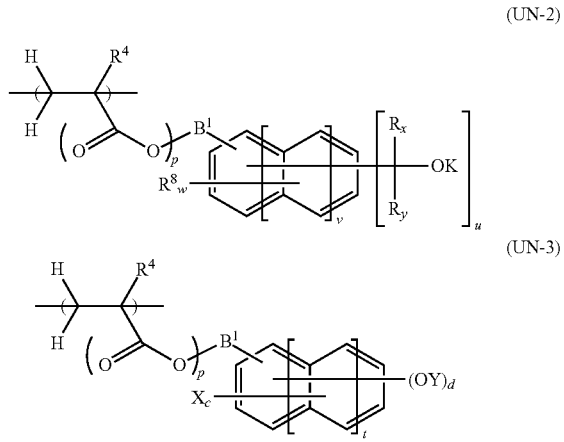

(UN-2)

(UN-3)

Herein p is each independently 0 or 1, $R^4$ is each independently hydrogen, fluorine, methyl or trifluoromethyl, $B^1$ is each independently a single bond or a $C_1$-$C_{10}$ alkylene group which may contain an ether bond, $R^5$ is hydrogen, halogen, an optionally halo-substituted, straight, branched or cyclic $C_2$-$C_8$ acyloxy group, an optionally halo-substituted, straight, branched or cyclic $C_1$-$C_6$ alkyl group, or an optionally halo-substituted, straight, branched or cyclic $C_1$-$C_6$ alkoxy group, K is hydrogen, a straight, branched or cyclic $C_1$-$C_{10}$ monovalent aliphatic hydrocarbon group which may contain an ethereal oxygen atom, carbonyl moiety or carbonyloxy moiety at an intermediate of its chain, or an optionally substituted monovalent aromatic group, Rx and Ry are each independently hydrogen, a $C_1$-$C_{15}$ alkyl group which may be substituted with hydroxyl or alkoxy, or an optionally substituted monovalent aromatic group, Rx and Ry may bond together to form a ring with the carbon atom to which they are attached, excluding that Rx and Ry are hydrogen at the same time, u is an integer of 1 to 3, v is an integer of 0 to 2, w is an integer satisfying w≤5+2v−u, X is hydrogen, a substituted or unsubstituted, straight, branched or cyclic $C_1$-$C_{20}$ alkyl group, $C_2$-$C_{20}$ alkylthioalkyl group, halogen, nitro, cyano, sulfinyl, or sulfonyl group, Y is a $C_1$-$C_{20}$ alkyl group or $C_1$-$C_{20}$ acyl group, d is an integer of 0 to 5, t is an integer of 0 to 2, and c is an integer satisfying c≤5+2t−d.

When the base resin (B) contains the recurring units defined above, resolution is improved and a pattern with reduced line edge roughness (LER, the edge of a pattern becoming irregular) is obtainable. In particular, the unit of formula (UN-2) functions upon exposure to high-energy radiation, such that the acid-eliminatable group undergoes elimination reaction under the action of an acid which is generated by the acid generator (upon exposure to high-energy radiation). That is, the unit of formula (UN-2) itself induces alkali insolubilization and crosslinking reaction between polymer molecules.

In a more preferred embodiment, the base resin (B) further comprises recurring units of at least one type selected from units having the formulae (UN-4) and (UN-5). These recurring units contribute to an improvement in etch resistance.

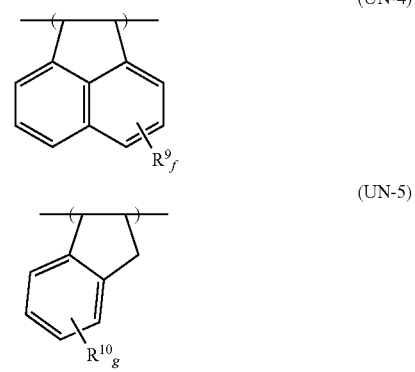

(UN-4)

(UN-5)

Herein $R^9$ is hydrogen, an optionally halo-substituted $C_1$-$C_6$ alkyl group or primary or secondary alkoxy group, or an optionally halo-substituted $C_2$-$C_7$ alkylcarbonyloxy group, f is an integer of 0 to 6, $R^{10}$ is hydrogen, an optionally halo-substituted $C_1$-$C_6$ alkyl group or primary or secondary alkoxy group, or an optionally halo-substituted $C_2$-$C_7$ alkylcarbonyloxy group, and g is an integer of 0 to 4.

In a preferred embodiment, the base resin (B) comprises recurring units of at least one type selected from sulfonium salt units having the general formulae (a1), (a2), and (a3).

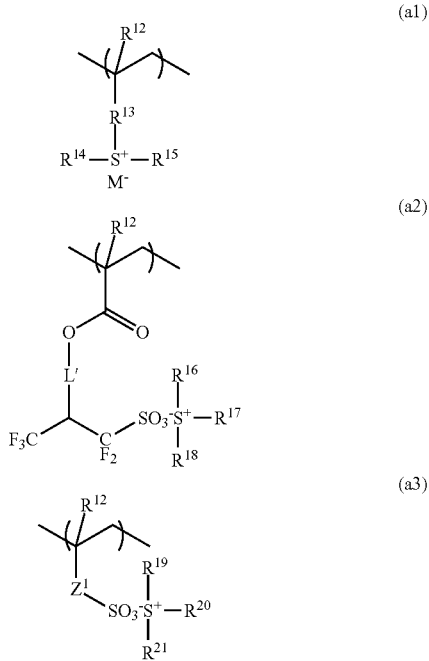

Herein $R^{12}$ is each independently hydrogen or methyl, $R^{13}$ is a single bond, phenylene group, —O—$R^{22}$—, or —C(=O)—$Z^2$—$R^{22}$—, $Z^2$ is oxygen or NH, $R^{22}$ is a straight, branched or cyclic $C_1$-$C_6$ alkylene, alkenylene or phenylene group which may contain a carbonyl (—CO—), ester (—COO—), ether (—O—) or hydroxyl moiety, L' is a single bond or —$Z^3$—C(=O)—O—, $Z^3$ is a straight, branched or cyclic $C_1$-$C_{20}$ divalent hydrocarbon group which may be substituted with a heteroatom, $Z^1$ is a single bond, methylene, ethylene, phenylene, fluorinated phenylene, —O—$R^{23}$—, or —C(=O)—$Z^4$—$R^{23}$—, $Z^4$ is oxygen or NH, $R^{23}$ is a straight, branched or cyclic $C_1$-$C_6$ alkylene, alkenylene or phenylene group which may contain a carbonyl, ester, ether or hydroxyl moiety, $M^-$ is a non-nucleophilic counter ion, $R^{14}$, $R^{15}$, $R^{16}$, $R^{17}$, $R^{18}$, $R^{19}$, $R^{20}$, and $R^{21}$ are each independently a straight $C_1$-$C_{20}$, branched or cyclic $C_3$-$C_{20}$ monovalent hydrocarbon group in which at least one hydrogen atom may be replaced by a heteroatom selected from oxygen, sulfur, nitrogen and halogen, or in which a heteroatom selected from oxygen, sulfur and nitrogen may intervene, so that a hydroxyl group, cyano group, carbonyl group, ether bond, ester bond, sulfonic acid ester bond, carbonate bond, lactone ring, sultone ring, carboxylic anhydride, or haloalkyl group may form or intervene, or $R^{14}$ and $R^{15}$ may bond together to form a ring with the sulfur atom, or any two or more of $R^{16}$, $R^{17}$ and $R^{18}$ or any two or more of $R^{19}$, $R^{20}$ and $R^{21}$ may bond together to form a ring with the sulfur atom.

In an alternate embodiment, the invention provides a photomask blank comprising a chemically amplified negative resist film comprising components (A), (B) and (D) defined above, and (C') a resin comprising recurring units of at least one type selected from sulfonium salt units having formulae (a1), (a2), and (a3) instead of component (C).

The photomask blank is useful when the resist film is exposed patternwise by the EB lithography. In order that the resist film exhibit a high sensitivity upon patternwise exposure to EB, the contents of acid generator (C) and basic compound (D) in the resist film should preferably be adjusted optimum for the EB lithography.

In another aspect, the invention provides a pattern forming process comprising the steps of exposing the resist film of the photomask blank to high-energy radiation without any intervening liquid, and developing the resist film in an alkaline developer to form a resist pattern.

The resist pattern forming process enables to form a resist pattern at a high accuracy even when EB lithography, SCALPEL (scattering with angular limitation projection electron-beam lithography), or lithography with high-energy radiation such as X-ray, γ-ray or synchrotron radiation is applied. As compared with a photomask blank having a resist film free of the polymer (A), the photomask blank of the invention is effective for preventing penetration of the acid and migration of any acid-neutralizing component from the antistatic film into the resist film. As a result, the age stability of the resist film is drastically improved.

The resist pattern forming process of the invention is applicable to any lithography of exposing the resist film to high-energy radiation without any intervening liquid. An example of exposure to high-energy radiation without any intervening liquid is beam irradiation, especially EB irradiation. Since EB irradiation is effective when a small number of patterns of wide variety are formed as in photomasks, EB irradiation is effectively applicable to the resist pattern forming process of the invention.

The resist pattern forming process is adequate to form a resist pattern from the resist film on the photomask blank. A photomask is prepared from the photomask blank at a high accuracy via the steps of forming a resist pattern on the photomask blank by the above process, and etching the photomask blank using the resist pattern as etch mask.

Advantageous Effects of Invention

Since the polymer (A) is present in the resist film, an antistatic film may be coated onto the resist film at a drastically improved efficiency, and the resist film may be patterned at a high accuracy. The polymer (A) segregates on the resist film surface, while the aromatic structure and hydrophilic group (e.g., hydroxyl) in the recurring unit having formula (1) exert the effects of preventing penetration of acid and migration of acid-neutralizing component from the antistatic film to the resist film. As a result, the age stability of the resist film after coating of the antistatic film is drastically improved. From the photomask blank having a resist film comprising the polymer (A), a photomask may be prepared at a high accuracy using the resist pattern formed in the resist film.

DESCRIPTION OF THE PREFERRED EMBODIMENT

In the specification, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. It is understood that for some structures represented by chemical formulae, there can exist enantiomers and diastereomers because of the presence of asymmetric carbon atoms. In such a case, a single formula collectively represents all such isomers. The isomers may be used alone or in admixture. In the chemical formulae, the broken line designates a valence bond, Me stands for methyl, and Ac for acetyl.

As used herein, EB stands for electron beam, PAG for photoacid generator, LER for line edge roughness, PEB for post-exposure bake, and Mw for weight average molecular weight.

Photomask Blank

According to the invention, a photomask blank has a chemically amplified negative resist film adapted for exposure to high-energy radiation. The resist film is defined as comprising (A) a polymer comprising recurring units represented by the general formula (1) and recurring units having at least one fluorine atom, (B) a base resin adapted to reduce its solubility in alkaline developer under the action of acid, (C) an acid generator, and (D) a basic compound.

A. Polymer

Component (A) is a polymer comprising recurring units represented by the general formula (1) and recurring units having at least one fluorine atom.

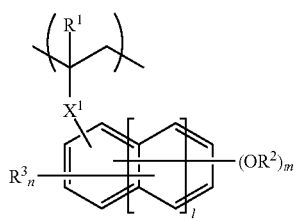

(1)

Herein $R^1$ is hydrogen or methyl. $R^2$ is hydrogen or a straight or branched $C_1$-$C_5$ monovalent hydrocarbon group in which at least one of carbon-bonded hydrogen atoms may be substituted by hydroxyl, or in which a heteroatom selected from oxygen, sulfur and nitrogen may intervene in a carbon-carbon bond. $R^3$ is a straight or branched $C_1$-$C_5$ monovalent hydrocarbon group in which at least one of carbon-bonded hydrogen atoms may be substituted by hydroxyl, or in which a heteroatom selected from oxygen, sulfur and nitrogen may intervene in a carbon-carbon bond. The subscript m is an integer of 1 to 3, n is an integer satisfying $0 \leq n \leq 5+2l-m$, wherein l is 0 or 1. $X^1$ is a single bond, —C(=O)O— or —C(=O)NH—.

Exemplary of the hydrocarbon groups are alkyl, alkenyl and alkynyl groups, with alkyl groups being preferred. Suitable alkyl groups include methyl, ethyl, n-propyl, isopropyl, n-butyl, isobutyl, sec-butyl, and n-pentyl. One or more or even all of carbon-bonded hydrogen atoms may be substituted by hydroxyl or amino. A heteroatom such as oxygen, sulfur or nitrogen may intervene in a carbon-carbon bond in the group.

In formula (1), —$OR^2$ is preferably a hydrophilic group. In this sense, $R^2$ is preferably hydrogen or a straight or branched $C_1$-$C_5$ monovalent hydrocarbon group. In the hydrocarbon group, one or more or even all of carbon-bonded hydrogen atoms may be substituted by a functionality such as hydroxyl or amino, or a heteroatom such as oxygen, sulfur or nitrogen may intervene in a carbon-carbon bond.

Illustrative, non-limiting examples of the recurring units having formula (1) are given below.

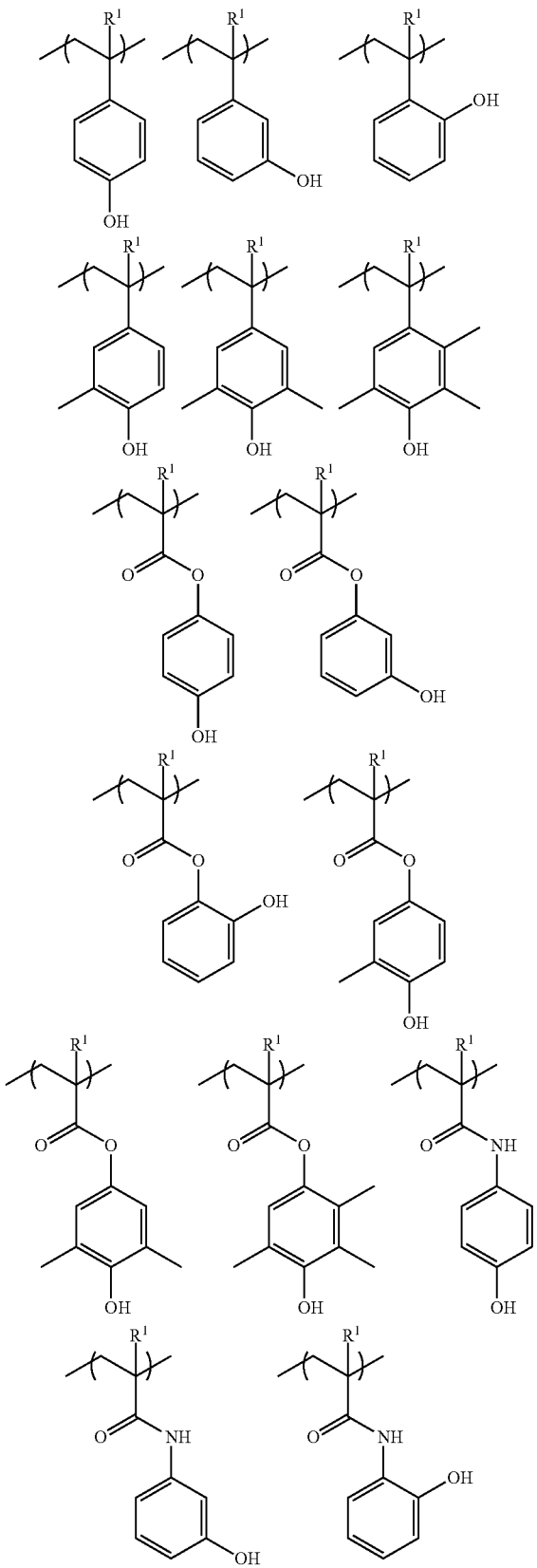

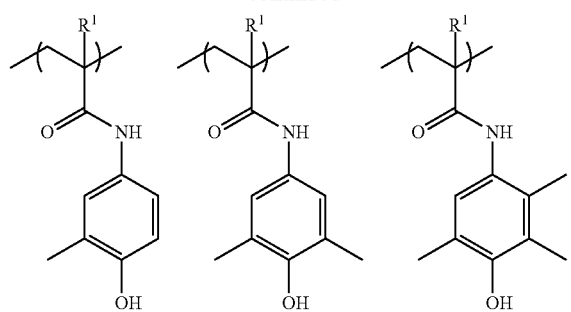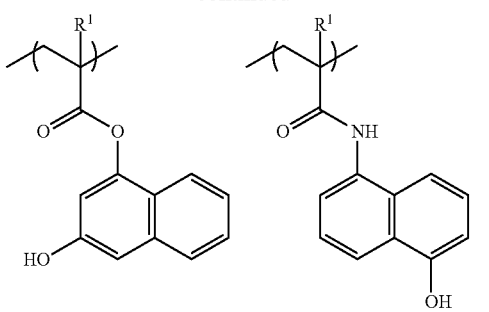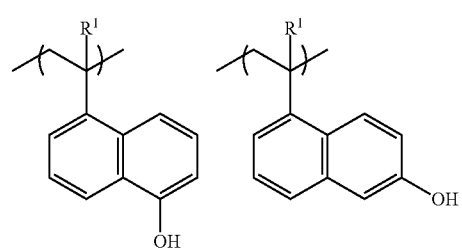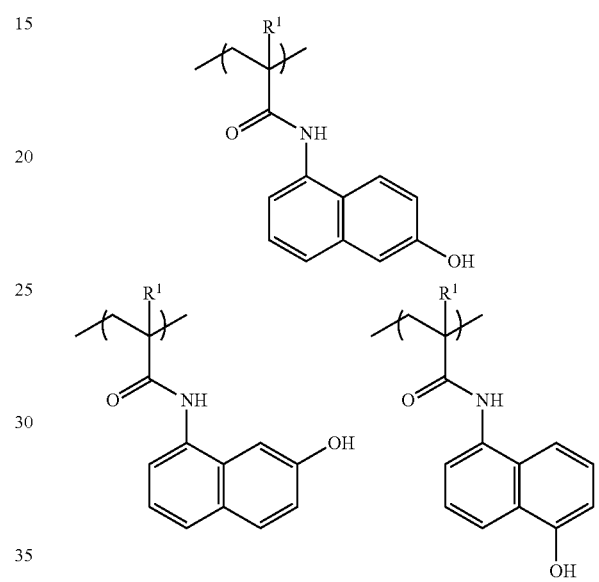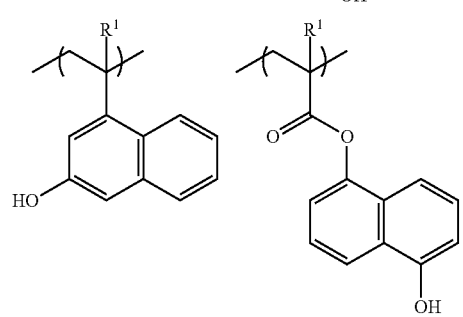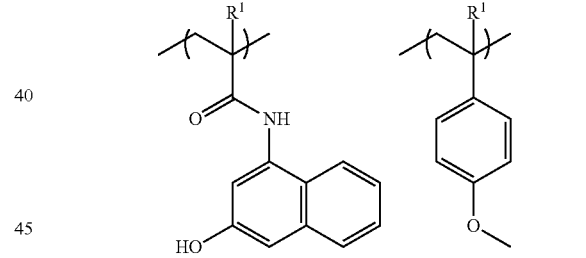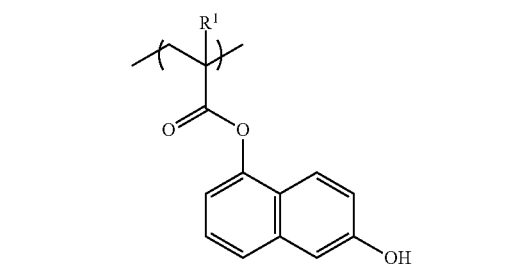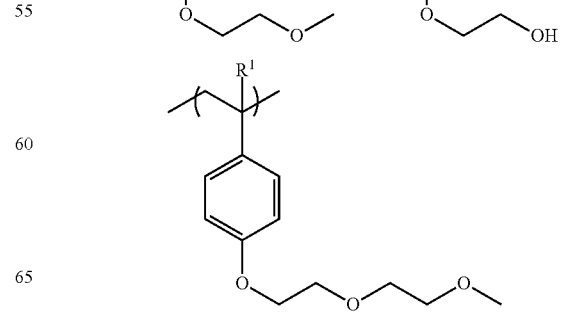

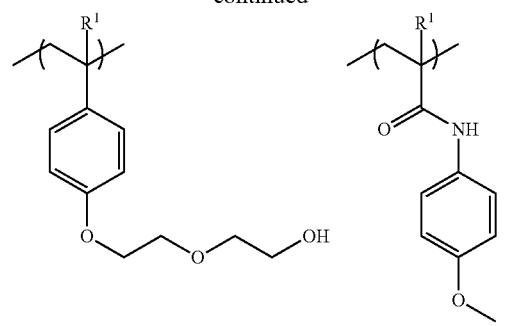
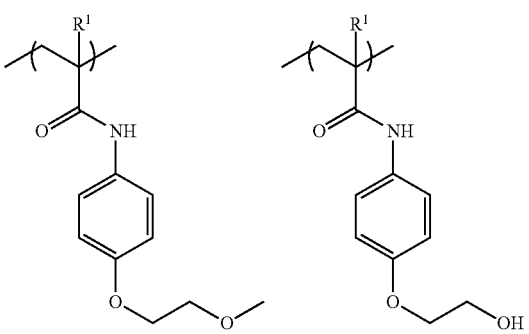
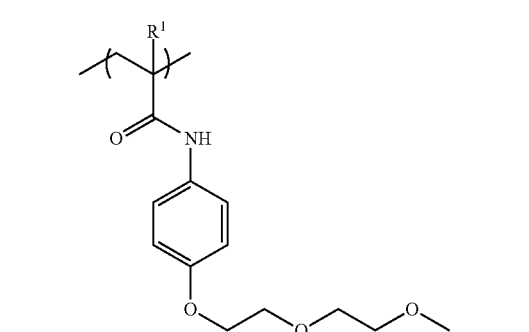
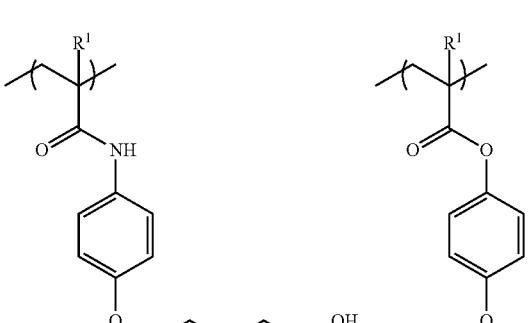
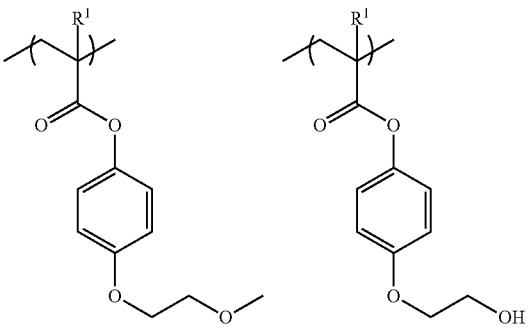
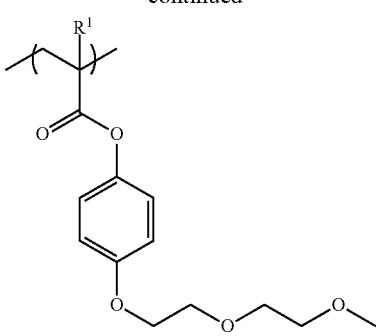
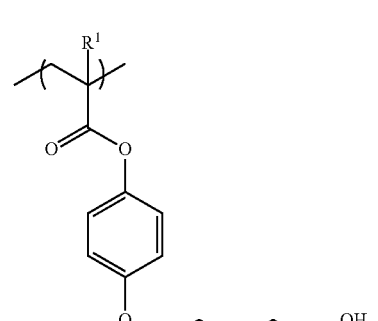

Herein $R^1$ is as defined above.

In formula (1), $X^1$ is preferably —C(=O)O— or —C(=O)NH— rather than a single bond. Also preferably RP is methyl. The inclusion of carbonyl in $X^1$ serves to improve the resist film's capability of trapping the acid originating from the antistatic film. The polymer of formula (1) wherein $R^1$ is methyl is a rigid polymer having a higher glass transition temperature (Tg), which is more effective for suppressing acid diffusion. As a result, the age stability of the resist film is improved, and the resolution and pattern profile are not degraded.

The recurring units having at least one fluorine atom are preferably units of at least one type selected from units having the formulae (2) to (7).

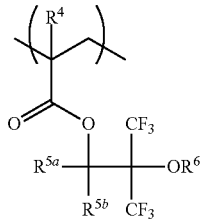

(2)

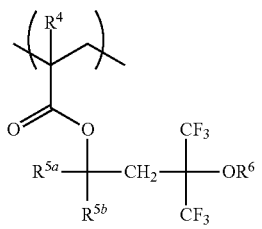

(3)

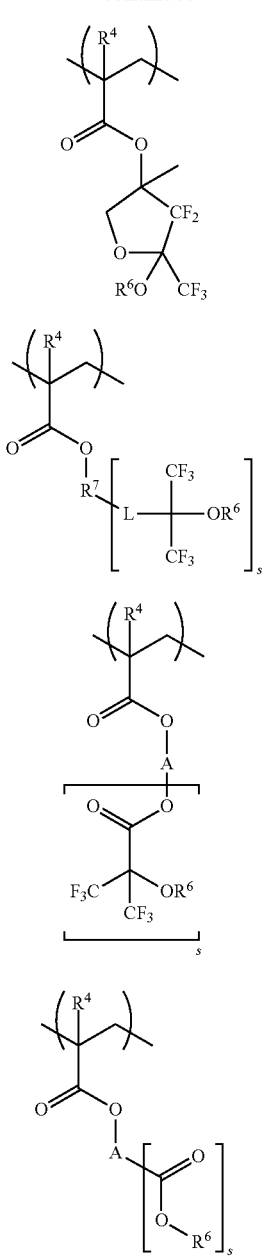

Herein $R^4$ is each independently hydrogen, fluorine, methyl or trifluoromethyl. $R^{5a}$ and $R^{5b}$ are each independently hydrogen or a straight, branched or cyclic $C_1$-$C_{10}$ alkyl group. $R^6$ is each independently hydrogen, a straight, branched or cyclic $C_1$-$C_{15}$ monovalent hydrocarbon or fluorinated hydrocarbon group, or an acid labile group, with the proviso that in the monovalent hydrocarbon or fluorinated hydrocarbon group represented by $R^6$, an ether bond (—O—) or carbonyl moiety (—C(=O)—) may intervene in a carbon-carbon bond. $R^7$ is a (s+1)-valent, cyclic $C_3$-$C_{20}$ hydrocarbon or fluorinated hydrocarbon group. L is a single bond or an optionally substituted divalent linking group. A is each independently a (s+1)-valent, straight, branched or cyclic $C_1$-$C_{20}$ hydrocarbon or fluorinated hydrocarbon group, with the proviso that at least one of $R^6$ and A in formula (7) contains fluorine. The subscript s is independently an integer of 1 to 3.

Examples of the straight, branched or cyclic $C_1$-$C_{10}$ alkyl group include methyl, ethyl, n-propyl, isopropyl, cyclopropyl, n-butyl, isobutyl, sec-butyl, tert-butyl, cyclobutyl, n-pentyl, cyclopentyl, n-hexyl, cyclohexyl, n-heptyl, n-octyl, n-nonyl, n-decyl, adamantyl, and norbornyl. Inter alia, straight, branched or cyclic $C_1$-$C_6$ alkyl groups are preferred.

Examples of the straight, branched or cyclic $C_1$-$C_{15}$ monovalent hydrocarbon group include alkyl, alkenyl and alkynyl groups, with alkyl groups being preferred. Examples of the alkyl group include n-undecyl, n-dodecyl, tridecyl, tetradecyl, and pentadecyl as well as those mentioned above. Examples of the straight, branched or cyclic $C_1$-$C_{15}$ monovalent fluorinated hydrocarbon group include the foregoing monovalent hydrocarbon groups in which some or all carbon-bonded hydrogen atoms are substituted by fluorine atoms.

Examples of the straight, branched or cyclic $C_1$-$C_{20}$ (s+1)-valent hydrocarbon or fluorinated hydrocarbon group include the foregoing exemplary monovalent hydrocarbon and fluorinated hydrocarbon groups, with a number "s" of hydrogen atoms being eliminated.

Suitable acid labile groups include tertiary alkyl groups and acetal groups of the formula (9) as will be described later.

The acid labile group is not particularly limited and any acid labile groups may be used as long as they are commonly used in many well-known chemically amplified resist compositions and can be eliminated with acid. A choice of tertiary alkyl group as the acid labile group is preferred because a pattern with minimal LER can be printed when the resist composition is coated as a thin film having a thickness of 10 to 100 nm, for example, and a fine pattern having a line width of up to 45 nm, for example, is formed in the thin film. Of tertiary alkyl groups, those of 4 to 18 carbon atoms are preferred because a monomer subject to polymerization can be isolated by distillation. Examples of the alkyl substituent group on tertiary carbon atom in the tertiary alkyl group include straight, branched or cyclic $C_1$-$C_{15}$ alkyl groups which may partially contain an oxygen-containing functionality such as an ether bond or carbonyl moiety. The alkyl substituent groups on tertiary carbon atom may bond together to form a ring.

Examples of the alkyl substituent group include methyl, ethyl, propyl, adamantyl, norbornyl, tetrahydrofuran-2-yl, 7-oxanorbornan-2-yl, cyclopentyl, 2-tetrahydrofuryl, tricyclo[5.2.1.0$^{2,6}$]decyl, tetracyclo[4.4.0.1$^{2,5}$.1$^{7,10}$]dodecyl, and 3-oxo-1-cyclohexyl.

Examples of the tertiary alkyl group having any of the foregoing alkyl substituent groups on tertiary carbon atom include, but are not limited to, t-butyl, t-pentyl, 1-ethyl-1-methylpropyl, 1,1-diethylpropyl, 1,1,2-trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

An acetal group of the following formula (9), which is one of commonly used acid labile groups, is a good choice because this acid labile group is capable of consistently forming a pattern defining a substantially rectangular interface with the substrate.

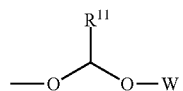
(9)

In formula (9), $R^{11}$ is selected from hydrogen and a straight, branched or cyclic $C_1$-$C_{10}$ alkyl group, depending on the design of sensitivity of a labile group to acid. For example, hydrogen is selected for the design of a labile group that has a relatively high stability and is decomposed with strong acid, whereas a straight alkyl group is selected for the design of a labile group that has a relatively high reactivity and provides a high sensitivity to pH changes. Although a choice depends on a combination of acid generator and basic compound in the resist composition, for the design of a labile group terminated with a relatively high alkyl group that provides a large change of solubility on decomposition, it is preferred that the carbon in $R^{11}$ bonded to the acetal carbon be secondary carbon. Exemplary of such $R^{11}$ are isopropyl, sec-butyl, cyclopentyl and cyclohexyl.

In formula (9), W is a straight, branched or cyclic $C_1$-$C_{30}$ alkyl group, preferably a $C_7$-$C_{30}$ polycyclic alkyl group for higher resolution. When W is a polycyclic alkyl group, it is preferred that secondary carbon constituting the polycyclic structure bond with the acetal oxygen. When the bond to secondary carbon of the cyclic structure is compared with the bond to tertiary carbon, the polymer becomes so stable that a resist composition comprising the same may be more shelf stable and experience no degradation of resolution. As compared with the polycyclic structure bonding on primary carbon via a straight alkyl group of at least one carbon atom, the polymer has such a glass transition temperature (Tg) that the resist pattern after development may not be deformed by bake.

Examples of the acetal group having formula (9) are shown below.

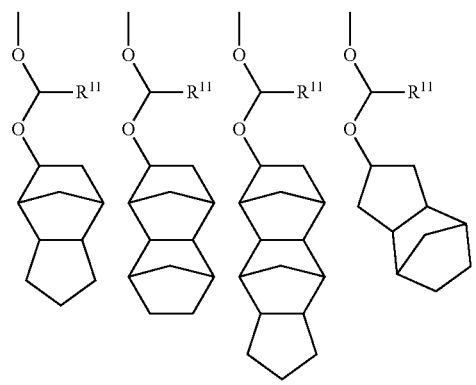

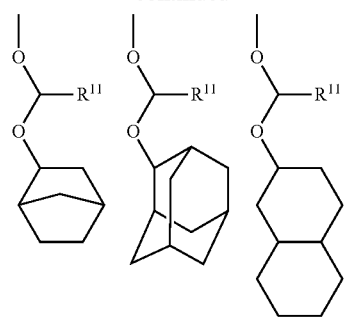

Herein $R^{11}$ is as defined above.

A phenolic hydroxyl group bonded to —$CH_2COO$— (tertiary alkyl group) may also be used as the acid labile group. The tertiary alkyl group included therein may be the same as the above-mentioned tertiary alkyl group for the protection of a phenolic hydroxyl group.

In formula (5), L is a single bond or an optionally substituted divalent linking group. Preferred linking groups are $C_1$-$C_{10}$ alkylene groups, examples of which include methylene, ethylene, propylene, butylene, pentylene, hexylene and structural isomers of a carbon skeleton having branched or cyclic structure.

Examples of the recurring units having formulae (2) to (7) are given below, but not limited thereto.

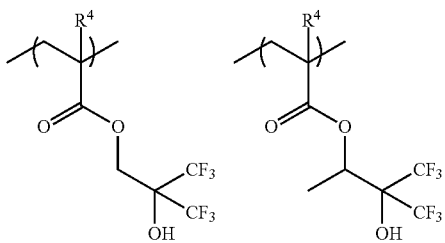

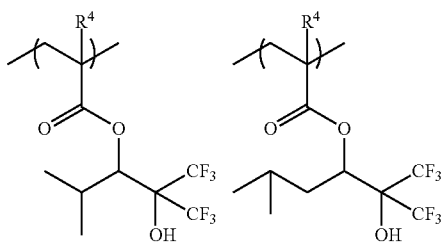

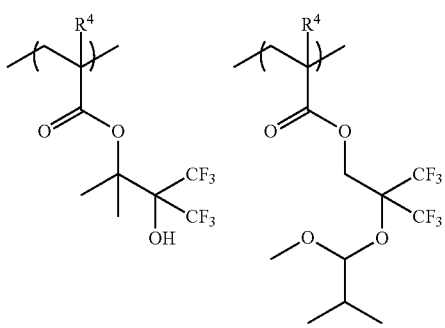

-continued
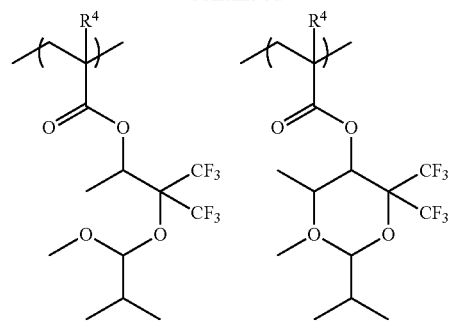
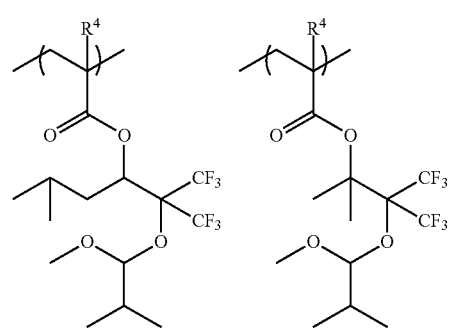
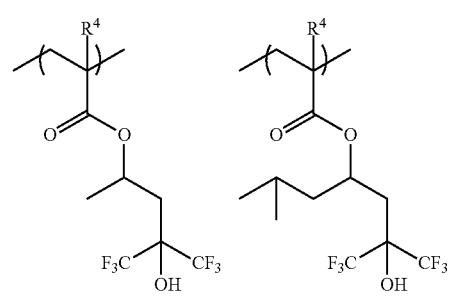
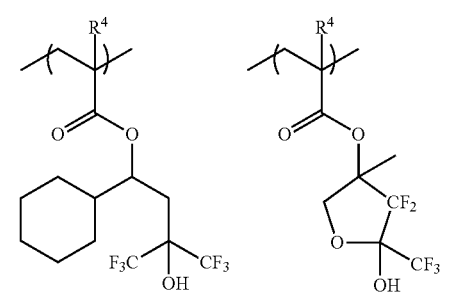
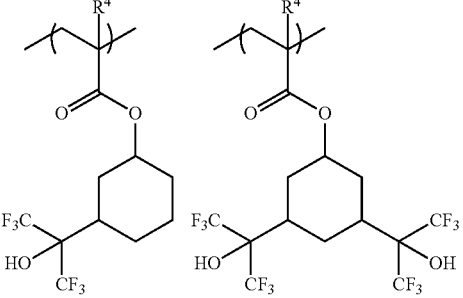
-continued
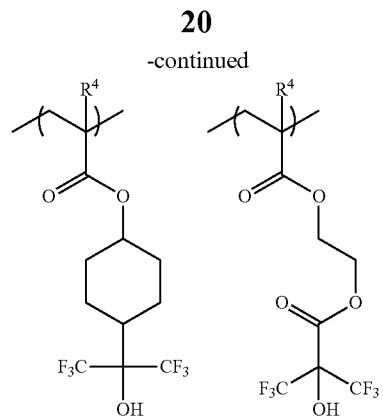
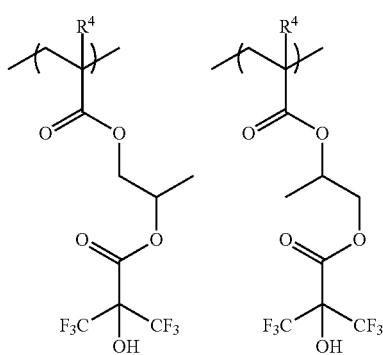
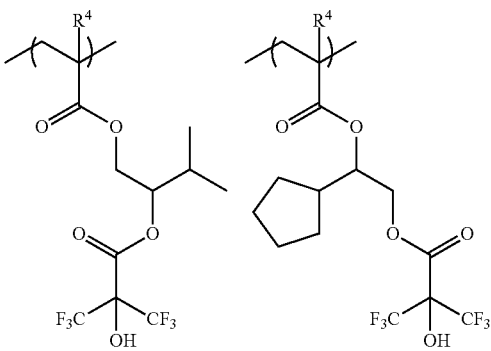
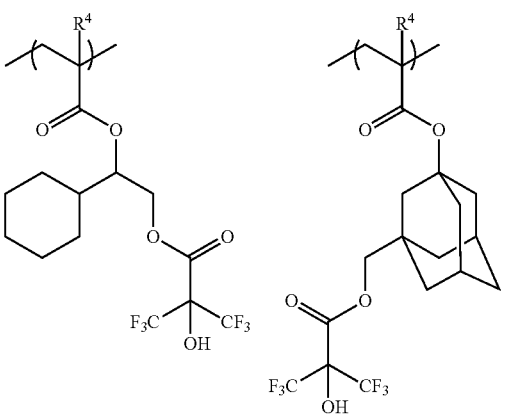

-continued
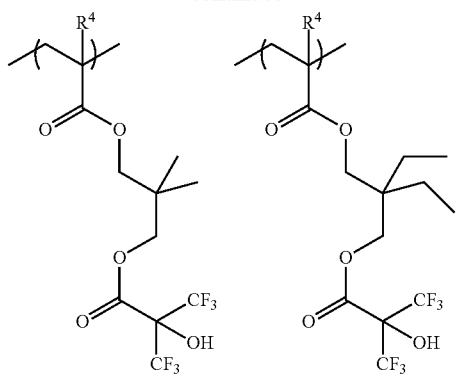
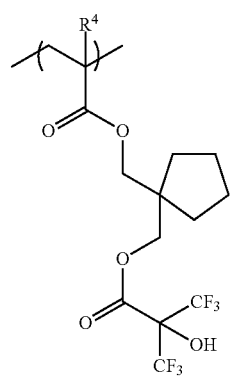
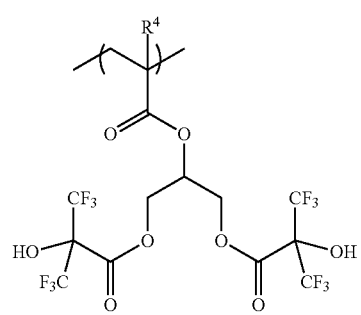
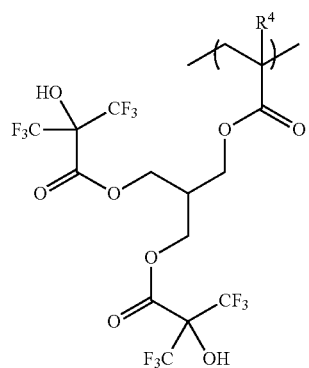
-continued
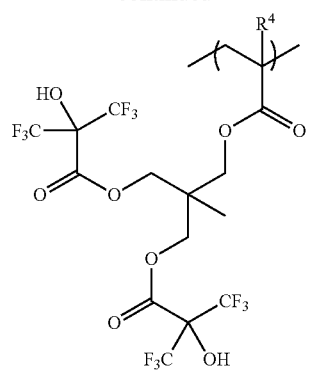
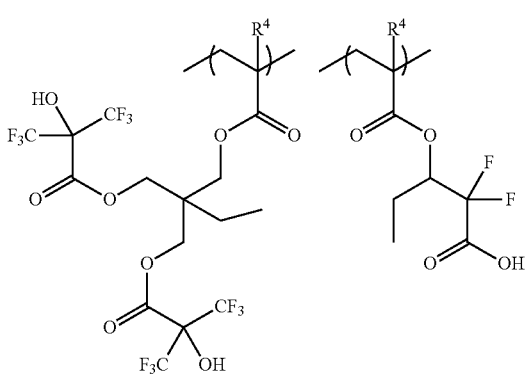
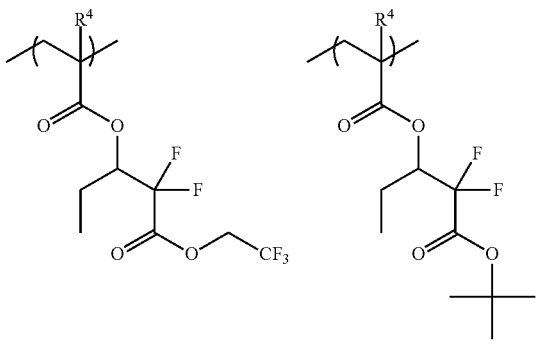
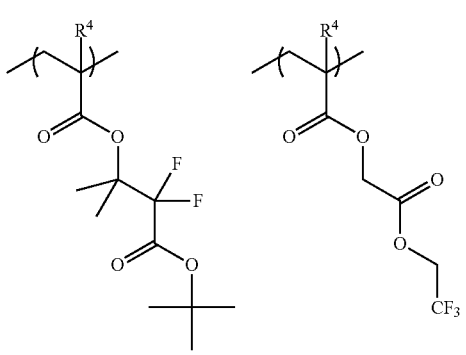

-continued

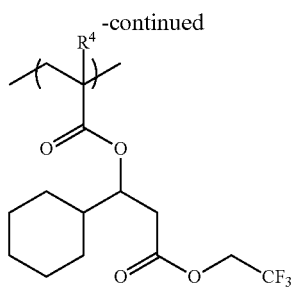

Herein R⁴ is as defined above.

In the polymer (A), the recurring units of formula (1) are preferably incorporated in an amount of 5 to 80 mol %, more preferably 15 to 70 mol % based on the entire recurring units. The recurring units of formulae (2) to (7) may be of a single type or a combination of two or more types, and are preferably incorporated in an amount of 20 to 95 mol %, more preferably 30 to 85 mol % based on the entire recurring units.

Besides the foregoing recurring units, the polymer (A) may comprise other recurring units. Other recurring units include those described in JP-A 2014-177407, paragraphs [0046] to [0078](U.S. Pat. No. 9,091,918). The other recurring units are preferably included in an amount of up to 50 mol % based on the entire recurring units.

The polymer (A) may be obtained by combining suitable monomers and copolymerizing them in the standard way while protection and deprotection reactions are combined if necessary. The copolymerization reaction is preferably radical polymerization or anionic polymerization though not limited thereto. For the polymerization reaction, reference may be made to JP-A 2004-115630.

The polymer (A) should preferably have a weight average molecular weight (Mw) of 2,000 to 50,000, and more preferably 3,000 to 20,000, as measured versus polystyrene standards by gel permeation chromatography (GPC) using tetrahydrofuran (THF) solvent. If Mw is less than 2,000, the polymer may help acid diffusion, detracting from resolution and age stability. With too much Mw, the polymer may have a low solubility in solvents and can generate coating defects.

The polymer (A) preferably has a molecular weight distribution or dispersity (Mw/Mn) of 1.0 to 2.2, more preferably 1.0 to 1.7.

The polymer (A) is preferably added in an amount of 0.1 to 50 parts by weight, and more preferably 0.5 to 20 parts by weight per 100 parts by weight of the base resin (B).

B. Base Resin

Component (B) is a base resin, preferably a polymer comprising recurring units having the general formula (UN-1).

(UN-1)

$B^1$ is a single bond or a $C_1$-$C_{10}$ alkylene group which may contain an ether bond. The subscript p is 0 or 1, r is an integer of 0 to 2, and a is an integer satisfying a≤5+2r−b, wherein b is an integer of 1 to 5. The recurring units of formula (UN-1) are to endow a resist film with etch resistance, substrate adhesion, and solubility in alkaline developer.

In formula (UN-1), $B^1$ is a single bond or a $C_1$-$C_{10}$ alkylene group which may contain an ether bond (or ethereal oxygen atom) at an intermediate of its chain. Preferred examples of the alkylene group include methylene, ethylene, propylene, butylene, pentylene, hexylene and structural isomers of a carbon skeleton having branched or cyclic structure. For the alkylene group containing an ether bond, in case p=0 in formula (UN-1), the atom in $B^1$ that bonds with the main chain becomes an ethereal oxygen atom, and a second ethereal oxygen atom may be incorporated at any position excluding the position between the α- and β-carbons relative to that ethereal oxygen atom. In case p=1, the ethereal oxygen atom may be incorporated at any position excluding the position between the α- and β-carbons relative to the ester oxygen. Alkylene groups having more than 10 carbon atoms are undesirable because of a low solubility in alkaline developer.

In formula (UN-1), $R^5$ is hydrogen or a $C_1$-$C_6$ alkyl group. Preferred examples of the $C_1$-$C_6$ alkyl group include methyl, ethyl, propyl, isopropyl, butyl, pentyl, hexyl and structural isomers of a carbon skeleton having branched or cyclic structure. Alkyl groups having more than 6 carbon atoms are undesirable because of a low solubility in alkaline developer.

The subscript a is an integer satisfying a≤5+2r−b, wherein b is an integer of 1 to 5. The subscript r is an integer of 0 to 2. The structure represents a benzene skeleton when r=0, a naphthalene skeleton when r=1, and an anthracene skeleton when r=2. In case r=0, preferably a is an integer of 0 to 3, and b is an integer of 1 to 3. In case r=1 or 2, preferably a is an integer of 0 to 4, and b is an integer of 1 to 5.

Of the recurring units of formula (UN-1), those recurring units wherein p is 0 and $B^1$ is a single bond (meaning that the aromatic ring is directly bonded to the main chain of the polymer), that is, linker-free recurring units are units derived from a monomer in which a 1-substituted or unsubstituted vinyl group is attached to a hydroxyl-substituted aromatic ring, typically hydroxystyrene unit. Preferred examples include 3-hydroxystyrene, 4-hydroxystyrene, 5-hydroxy-2-vinylnaphthalene, and 6-hydroxy-2-vinylnaphthalene.

Those recurring units wherein p is 1, that is, recurring units having an ester structure as the linker are units of carbonyl-substituted vinyl monomers as typified by (meth)acrylates. Preferred examples of the units of formula (UN-1) having a linker (—CO—O—$B^1$—) derived from (meth)acrylates are shown below.

Herein R⁴ is hydrogen, fluorine, methyl or trifluoromethyl. R⁵ is each independently hydrogen or a $C_1$-$C_6$ alkyl group.

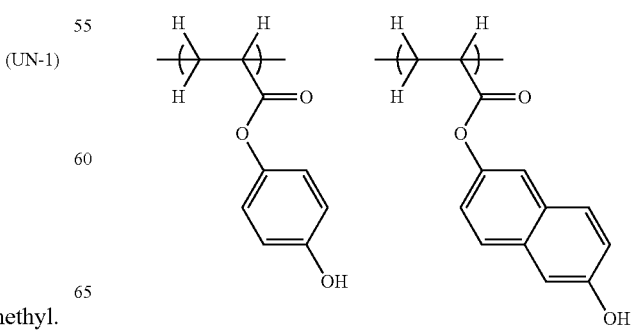

-continued

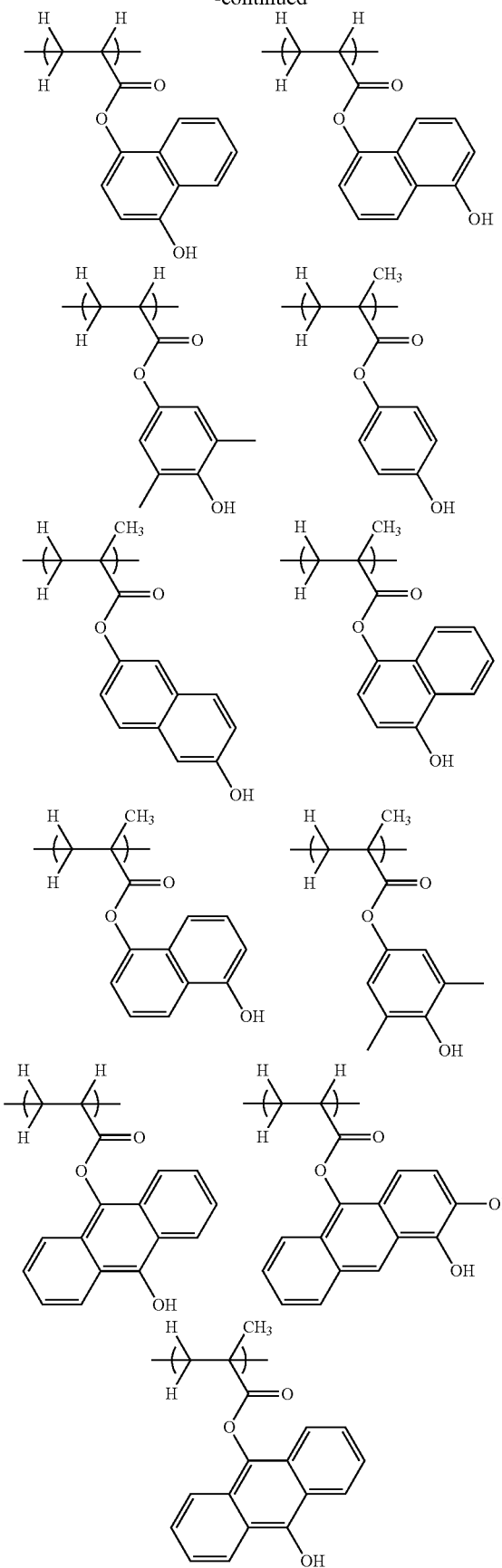

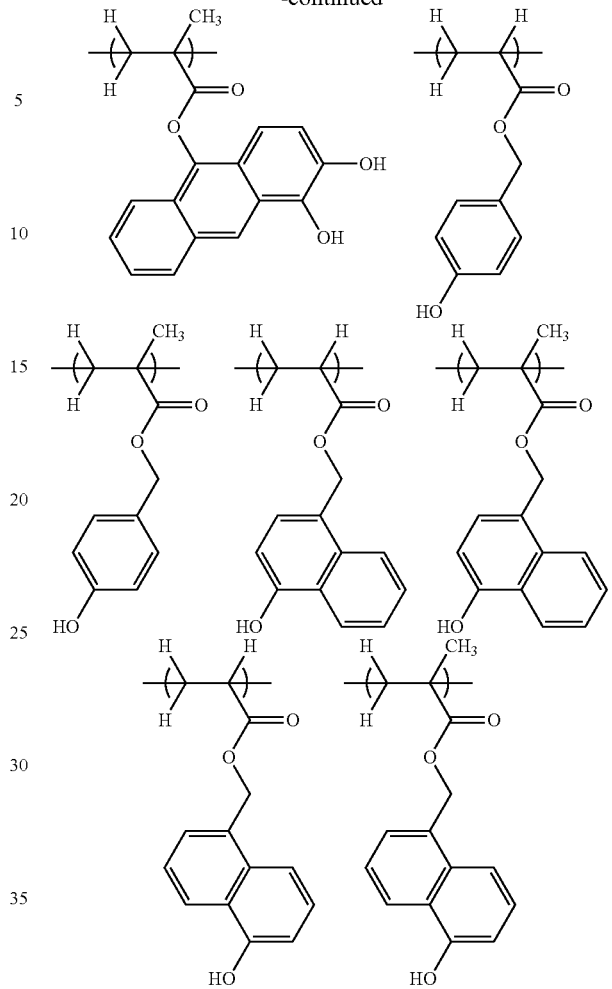

The polymer used as the base resin may further comprise recurring units of at least one type having the general formulae (UN-2) and (UN-3).

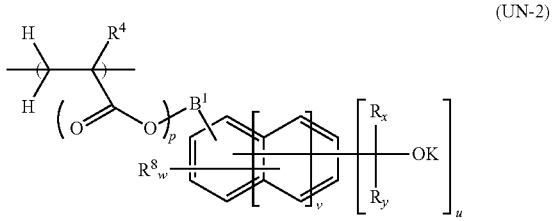
(UN-2)

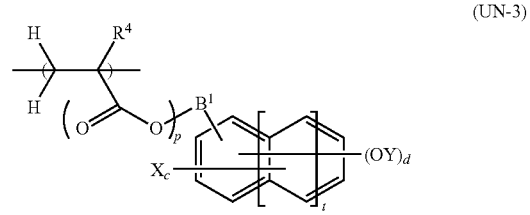
(UN-3)

Herein p is each independently 0 or 1. $R^4$ is each independently hydrogen, fluorine, methyl or trifluoromethyl. $B^1$ is each independently a single bond or a $C_1$-$C_{10}$ alkylene group which may contain an ether bond. $R^8$ is hydrogen, halogen, an optionally halo-substituted, straight, branched or cyclic $C_2$-$C_8$ acyloxy group, an optionally halo-substituted, straight, branched or cyclic $C_1$-$C_6$ alkyl group, or an optionally halo-substituted, straight, branched or cyclic $C_1$-$C_6$ alkoxy group. K is hydrogen, a straight, branched or cyclic $C_1$-$C_{10}$ monovalent aliphatic hydrocarbon group which may contain an ethereal oxygen atom, carbonyl moiety or carbonyloxy moiety at an intermediate of its chain, or an optionally substituted monovalent aromatic group. Rx and Ry are each independently hydrogen, a $C_1$-$C_{15}$ alkyl group which may be substituted with hydroxyl or alkoxy, or an optionally substituted monovalent aromatic group, Rx and Ry may bond together to form a ring with the carbon atom to which they are attached, excluding that Rx and Ry are hydrogen at the same time. The subscript u is an integer of 1 to 3, v is an integer of 0 to 2, w is an integer satisfying w≤5+2v−u. X is hydrogen, a substituted or unsubstituted, straight, branched or cyclic $C_1$-$C_{20}$ alkyl group, $C_2$-$C_{20}$ alkylthioalkyl group, halogen, nitro, cyano, sulfinyl, or sulfonyl group. Y is a $C_1$-$C_{20}$ alkyl group or $C_1$-$C_{20}$ acyl group. The subscript d is an integer of 0 to 5, t is an integer of 0 to 2, and c is an integer satisfying c≤5+2t−d.

The recurring unit of formula (UN-2) functions upon exposure to high-energy radiation, such that the acid-eliminatable group undergoes elimination reaction under the action of an acid which is generated by the acid generator (upon exposure to high-energy radiation). That is, the unit of formula (UN-2) itself induces alkali insolubilization and crosslinking reaction between polymer molecules.

In formulae (UN-2) and (UN-3), $B^1$ is a single bond or a $C_1$-$C_{10}$ alkylene group which may contain an ether bond (or ethereal oxygen atom) at an intermediate of its chain. Preferred examples of the alkylene group include methylene, ethylene, propylene, butylene, pentylene, hexylene and structural isomers of a carbon skeleton having branched or cyclic structure. For the alkylene group containing an ether bond, in case p=0 in formula (UN-2) or (UN-3), the atom in $B^1$ that bonds with the main chain becomes an ethereal oxygen atom, and a second ethereal oxygen atom may be incorporated at any position excluding the position between the α- and β-carbons relative to that ethereal oxygen atom. In case p=1, the ethereal oxygen atom may be incorporated at any position excluding the position between the α- and β-carbons relative to the ester oxygen. Alkylene groups having more than 10 carbon atoms are undesirable because of a low solubility in alkaline developer.

When the acid eliminatable group-bearing side chain substitutes on the aromatic ring, u indicative of the substitution number is an integer of 1 to 3. K is hydrogen, a straight, branched or cyclic $C_1$-$C_{10}$ monovalent aliphatic hydrocarbon group which may contain an ethereal oxygen atom, carbonyl moiety or carbonyloxy moiety at an intermediate of its chain, or an optionally substituted monovalent aromatic group. Preferred examples include hydrogen, methyl, ethyl, propyl, isopropyl, cyclopentyl, cyclohexyl, adamantyl, methylcarbonyl and phenyl.

Rx and Ry are each independently hydrogen, a $C_1$-$C_{15}$ alkyl group which may be substituted with hydroxyl or alkoxy, or an optionally substituted monovalent aromatic group, Rx and Ry may bond together to form a ring with the carbon atom to which they are attached. It is excluded that Rx and Ry are hydrogen at the same time. Preferred structures of Rx and Ry include methyl, ethyl, propyl, butyl and structural isomers thereof, and the foregoing having hydroxyl or alkoxy substituted thereon.

In formula (UN-2), the aromatic ring may be bonded to the main chain via a single bond or via a carbonyloxy group or a linker $B_1$. The subscript v is an integer of 0 to 2. The structure represents a benzene skeleton when v=0, a naphthalene skeleton when v=1, and an anthracene skeleton when v=2.

$B^1$ is a single bond or a $C_1$-$C_{10}$ alkylene group which may contain an ether bond (or ethereal oxygen atom) at an intermediate of its chain. Preferred examples of the alkylene group include methylene, ethylene, propylene, butylene, pentylene, hexylene and structural isomers of a carbon skeleton having branched or cyclic structure. For the alkylene group containing an ether bond, in case p=1 in formula (UN-2), the ethereal oxygen atom may be incorporated at any position excluding the position between the α- and β-carbons relative to the ester oxygen. In case p=0, the atom in $B^1$ that bonds with the main chain becomes an ethereal oxygen atom, and a second ethereal oxygen atom may be incorporated at any position excluding the position between the α- and β-carbons relative to that ethereal oxygen atom.

Preferred examples of the recurring unit of formula (UN-2) are given below.

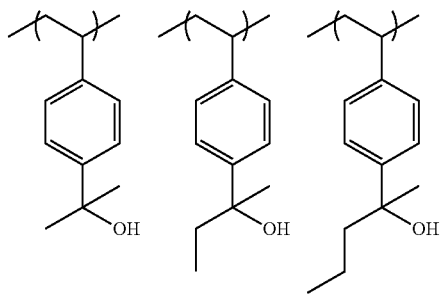

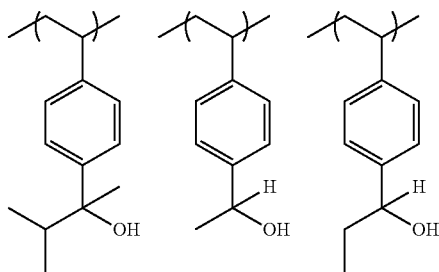

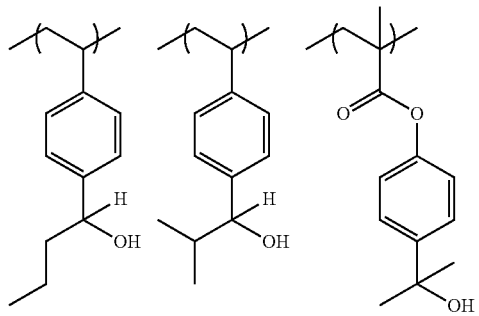

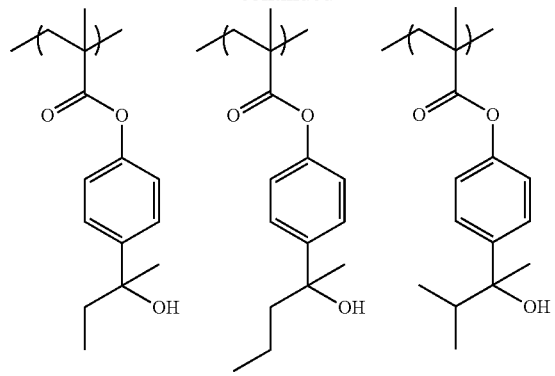
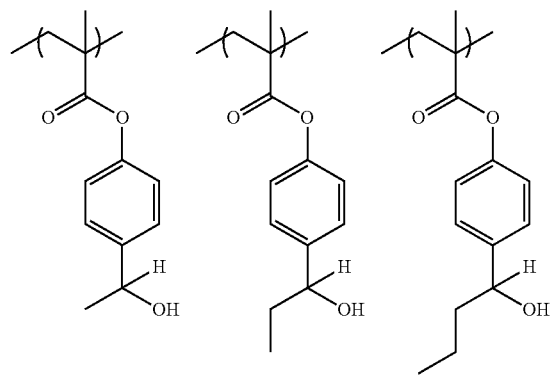
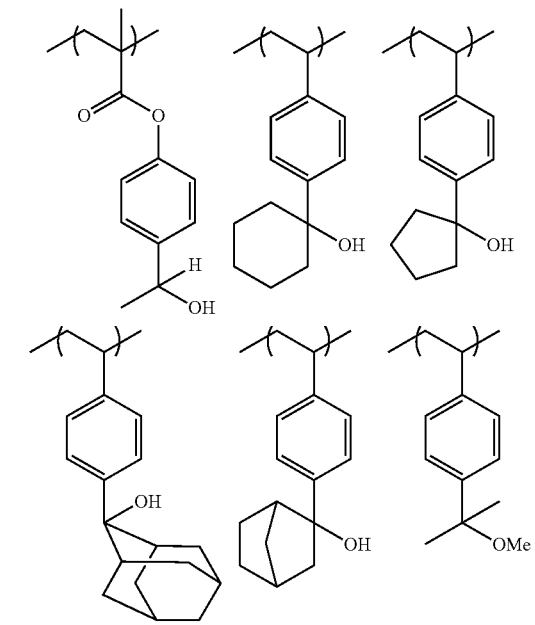
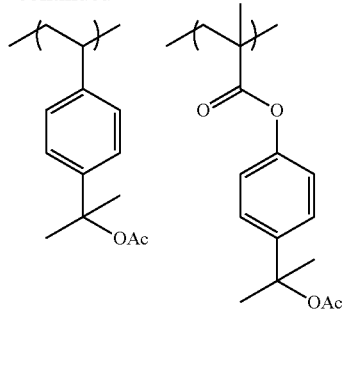
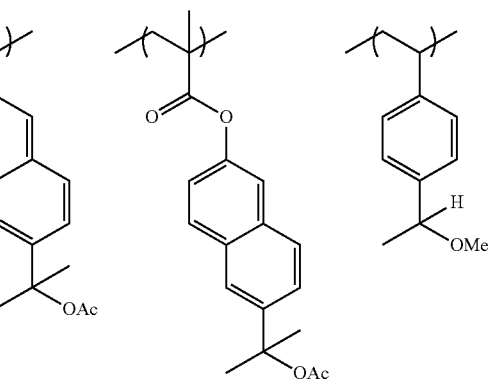
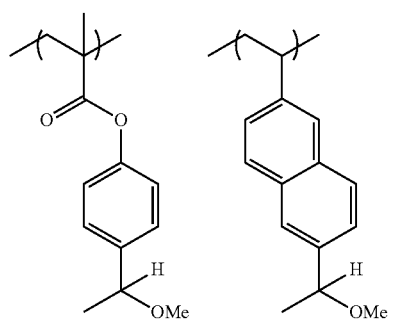
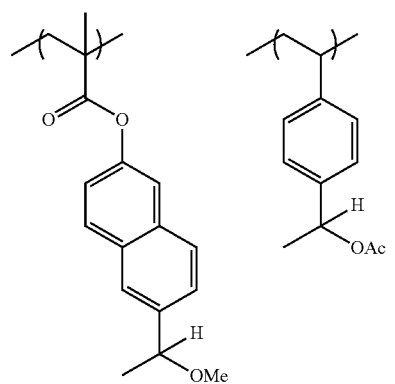

-continued
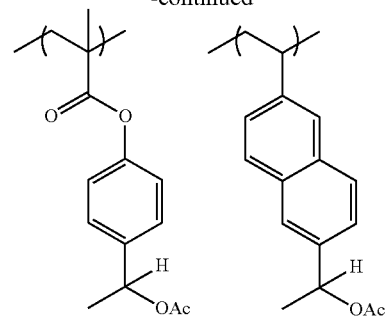
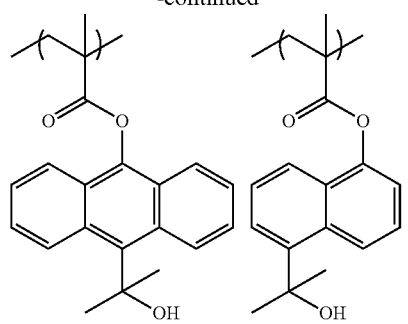
-continued
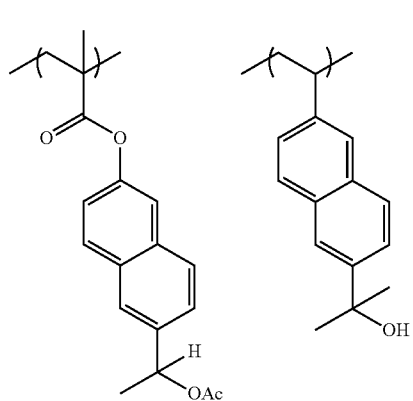
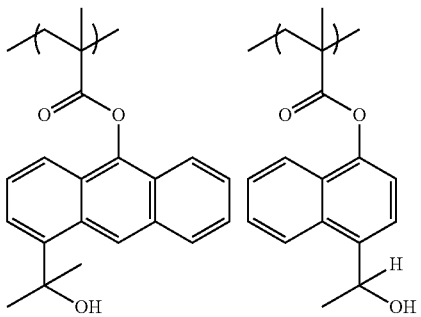
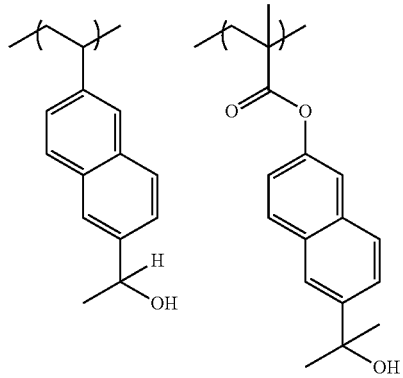
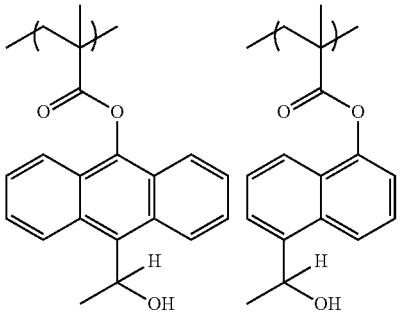
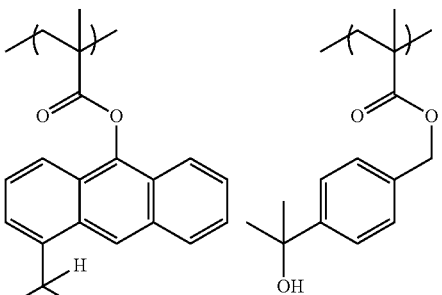
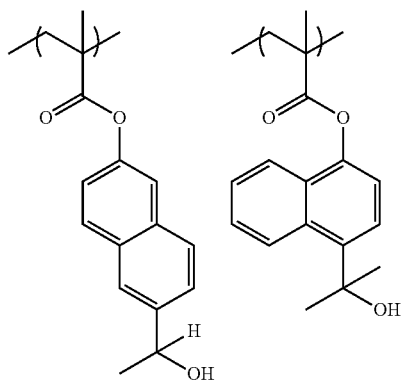
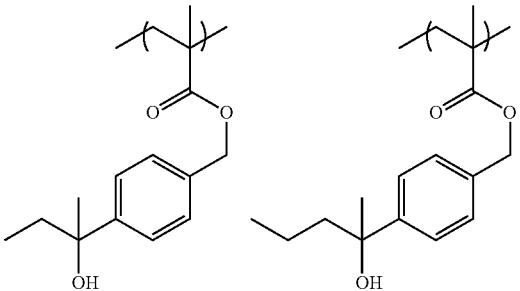

-continued

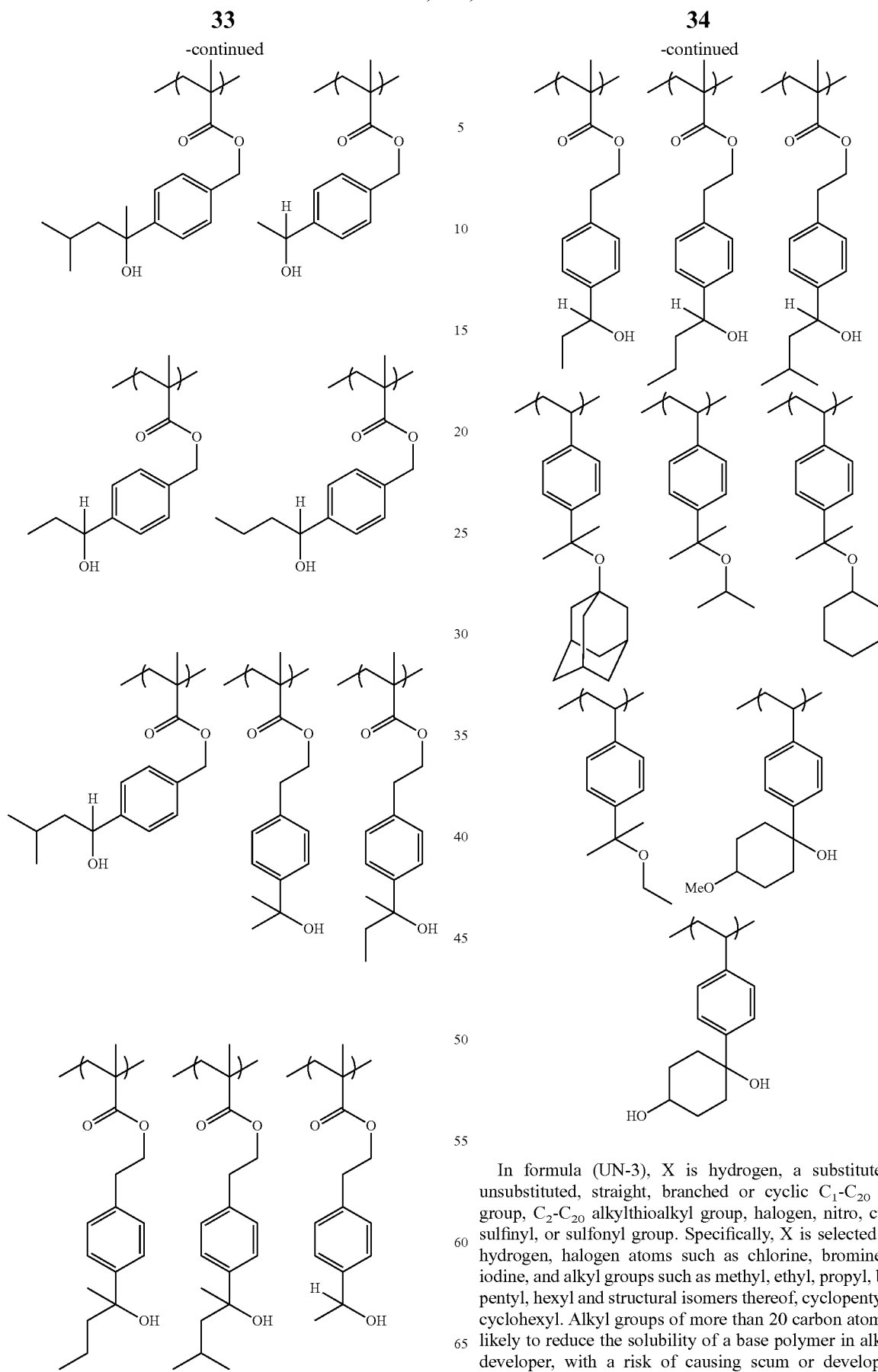

In formula (UN-3), X is hydrogen, a substituted or unsubstituted, straight, branched or cyclic $C_1$-$C_{20}$ alkyl group, $C_2$-$C_{20}$ alkylthioalkyl group, halogen, nitro, cyano, sulfinyl, or sulfonyl group. Specifically, X is selected from hydrogen, halogen atoms such as chlorine, bromine and iodine, and alkyl groups such as methyl, ethyl, propyl, butyl, pentyl, hexyl and structural isomers thereof, cyclopentyl and cyclohexyl. Alkyl groups of more than 20 carbon atoms are likely to reduce the solubility of a base polymer in alkaline developer, with a risk of causing scum or development defects. Of the foregoing substituent groups of X, hydrogen, chlorine, bromine, iodine, methyl, and ethyl are useful because starting monomers are readily available.

In formula (UN-3), Y is $C_1$-$C_{20}$ alkyl or $C_1$-$C_{20}$ acyl, preferably $C_1$-$C_6$ alkyl or $C_2$-$C_7$ acyl. When Y is alkyl, OY is alkoxy. When Y is acyl, OY is acyloxy. Preferred examples of the alkoxy group include methoxy, ethoxy, propoxy, butoxy, pentyloxy, hexyloxy and structural isomers of the hydrocarbon moiety, cyclopentyloxy, and cyclohexyloxy, with methoxy and ethoxy being useful. The acyloxy group may be readily introduced by the chemical modification method even after polymerization, and is useful in finely adjusting the solubility of a base polymer in alkaline developer. Preferred examples of the acyloxy group include methylcarbonyloxy, ethylcarbonyloxy, propylcarbonyloxy, butylcarbonyloxy, pentylcarbonyloxy, hexylcarbonyloxy and structural isomers thereof, cyclopentylcarbonyloxy, cyclohexylcarbonyloxy, and benzoyloxy.

The subscript c is an integer satisfying $c \leq 5+2t-d$, d is an integer of 0 to 5, and t is an integer of 0 to 2. The structure represents a benzene skeleton when t=0, a naphthalene skeleton when t=1, and an anthracene skeleton when t=2. In case t=0, preferably c is an integer of 0 to 3 and d is an integer of 0 to 3. In case t=1 or 2, preferably c is an integer of 0 to 4 and d is an integer of 0 to 5.

Of the recurring units of formula (UN-3), those recurring units wherein p is 0 and $B^1$ is a single bond (meaning that the aromatic ring is directly bonded to the main chain of the polymer), that is, linker-free recurring units are units derived from monomers in which a 1-substituted or unsubstituted vinyl group is attached to an aromatic ring, as typified by styrene skeleton and which are substituted with X and/or OY.

Preferred examples of the units of formula (UN-3) wherein p=0 and $B^1$ is a single bond are shown below.

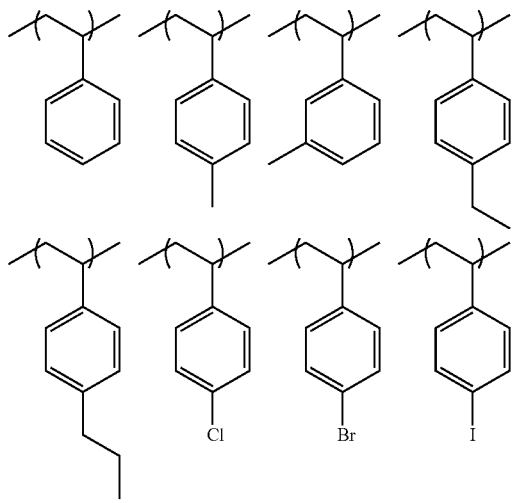

Those recurring units wherein p is 1, that is, recurring units having an ester structure as the linker are units of carbonyl-substituted vinyl monomers as typified by (meth)acrylates.

Preferred examples of the units of formula (UN-3) having a linker (—CO—O—$B^1$—) derived from (meth)acrylates are shown below.

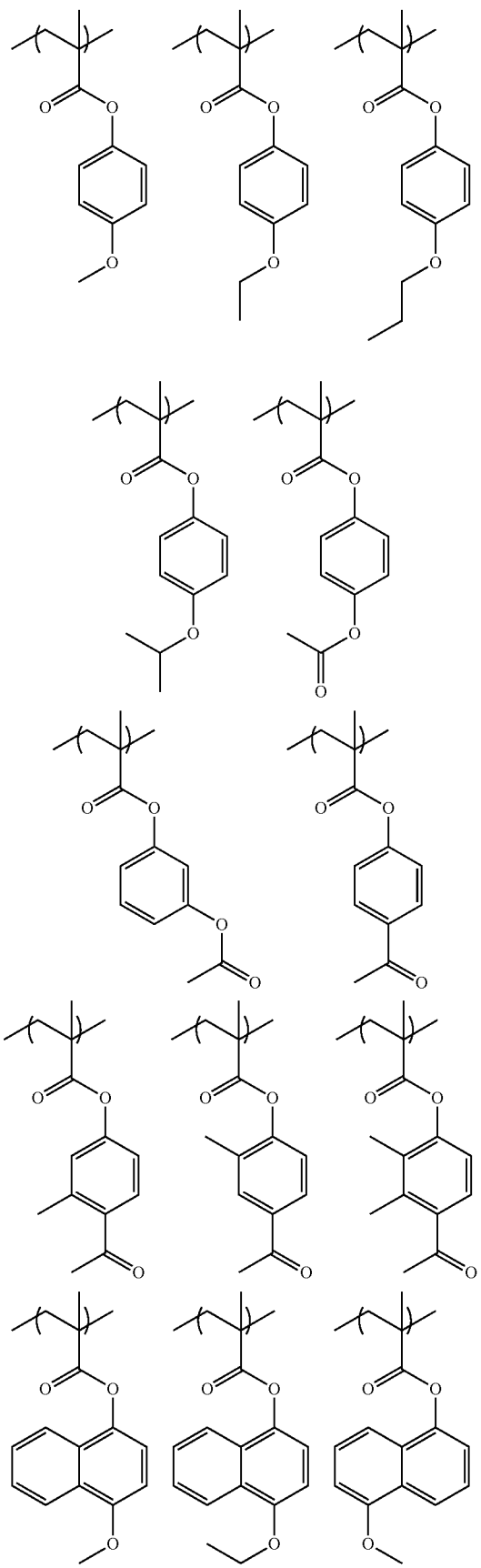

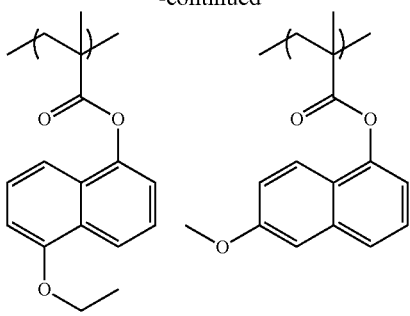

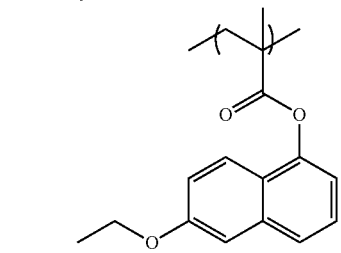

The polymer used in the base resin in the resist composition may further comprise recurring units of at least one type selected from formulae (UN-4) and (UN-5) as main constituent units.

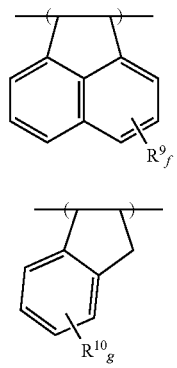 (UN-4)

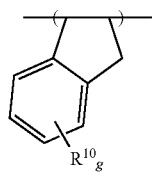 (UN-5)

Herein $R^9$ is hydrogen, an optionally halo-substituted $C_1$-$C_6$ alkyl group or primary or secondary alkoxy group, or an optionally halo-substituted $C_2$-$C_7$ alkylcarbonyloxy group, and f is an integer of 0 to 6. $R^{10}$ is hydrogen, an optionally halo-substituted $C_1$-$C_6$ alkyl group or primary or secondary alkoxy group, or an optionally halo-substituted $C_2$-$C_7$ alkylcarbonyloxy group, and g is an integer of 0 to 4.

When the recurring units of at least one type selected from recurring units having formulae (UN-4) and (UN-5) are incorporated, etching resistance is further improved because not only the aromatic ring possesses etching resistance, but the cyclic structure incorporated into the main chain also exerts the effect of improving resistance to EB irradiation during etching and pattern inspection steps.

The recurring units having formulae (UN-4) and (UN-5) which incorporate a cyclic structure into the main chain to improve etching resistance may be of one type or a combination of plural types. The units of formulae (UN-4) and (UN-5) are preferably incorporated in a range of at least mol % based on the overall recurring units of the polymer in order to exert an effect of improving etching resistance.

The polymer used as the base resin may further comprise recurring units of at least one type selected from sulfonium salt units having formulae (a1) to (a3).

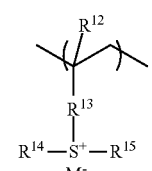 (a1)

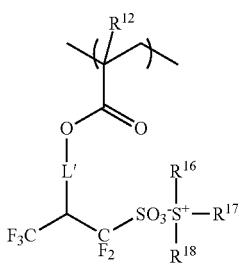 (a2)

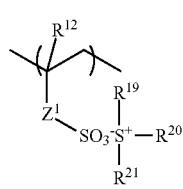 (a3)

In the formulae, $R^{12}$ is independently hydrogen or methyl. $R^{13}$ is a single bond, phenylene, —O—$R^{22}$—, or —C(=O)—$Z^2$—$R^{22}$—, wherein $Z^2$ is oxygen or —NH—, and $R^{22}$ is a straight, branched or cyclic $C_1$-$C_6$ alkylene group, alkenylene group or phenylene group, which may contain a carbonyl (—CO—), ester (—COO—), ether (—O—) or hydroxyl moiety. L' is a single bond or —$Z^3$—C(=O)—O— wherein $Z^3$ is a straight, branched or cyclic $C_1$-$C_{20}$ divalent hydrocarbon group which may be substituted with a heteroatom. $Z^1$ is a single bond, methylene, ethylene, phenylene, fluorinated phenylene, —O—$R^{23}$—, or —C(=O)—$Z^4$—$R^{23}$—, wherein $Z^4$ is oxygen or NH, and $R^{23}$ is a straight, branched or cyclic $C_1$-$C_6$ alkylene, alkenylene or phenylene group which may contain a carbonyl, ester, ether or hydroxyl moiety. M$^-$ is a non-nucleophilic counter ion. $R^{14}$, $R^{15}$, $R^{16}$, $R^{17}$, $R^{18}$, $R^{19}$, $R^{20}$, and $R^{21}$ are each independently a straight $C_1$-$C_{20}$, branched or cyclic $C_3$-$C_{20}$ monovalent hydrocarbon group which may be substituted with or separated by a heteroatom. Examples of the hydrocarbon group include alkyl groups such as methyl, ethyl, n-propyl, isopropyl, n-butyl, tert-butyl, cyclopropyl, cyclopentyl, cyclohexyl, cyclopropylmethyl, 4-methylcyclohexyl, cyclohexylmethyl, norbornyl, and adamantyl; alkenyl groups such as vinyl, allyl, propenyl, butenyl, hexenyl, and cyclohexenyl; aryl groups such as phenyl, naphthyl and thienyl; and aralkyl groups such as benzyl, 1-phenylethyl, and 2-phenylethyl, with the aryl groups being more preferred. In these groups, at least one hydrogen atom may be replaced by a heteroatom selected from oxygen, sulfur, nitrogen and halogen, or a heteroatom selected from oxygen, sulfur and nitrogen may intervene, so that a hydroxyl group, cyano group, carbonyl group, ether bond, ester bond, sulfonic acid ester bond, carbonate bond, lactone ring, sultone ring, carboxylic anhydride, or haloalkyl group may form or intervene. $R^{14}$ and $R^{15}$ may bond together to form a ring with the sulfur atom in the formula, or any two or more of $R^{16}$, $R^{17}$ and $R^{18}$ or any two or more of $R^{19}$, $R^{20}$ and $R^{21}$ may bond together to form a ring with the sulfur atom in the formula.

In formula (a2) wherein L' is —$Z^3$—C(=O)—O—, $Z^3$ is a straight, branched or cyclic $C_1$-$C_{20}$ divalent hydrocarbon group which may be substituted with a heteroatom. Illustrative, non-limiting examples of the hydrocarbon group $Z^3$ are given below.

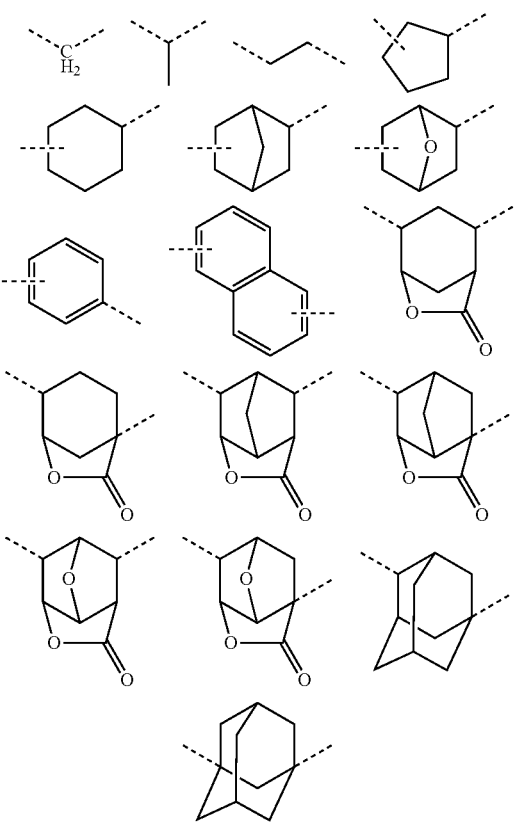

Where $R^{14}$ and $R^{15}$ bond together to form a ring with the sulfur atom, or where any two or more of $R^{16}$, $R^{17}$ and $R^{18}$ or any two or more of $R^{19}$, $R^{20}$ and $R^{21}$ bond together to form a ring with the sulfur atom, exemplary ring structures are shown below.

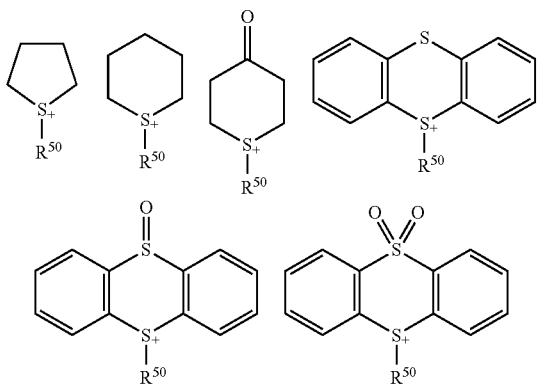

It is noted that $R^{50}$ is the same as defined and exemplified for $R^{14}$ to $R^{21}$.

Examples of the sulfonium cation in formulae (a2) and (a3) are shown below, but not limited thereto.

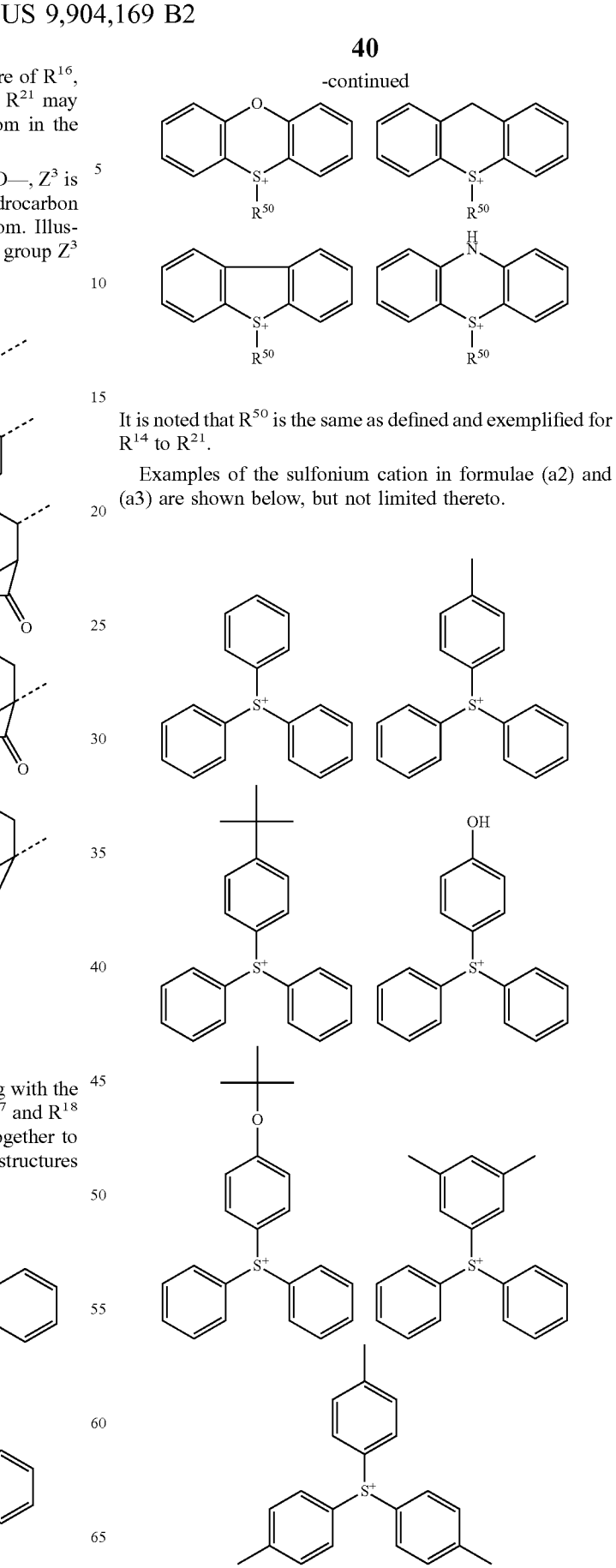

-continued
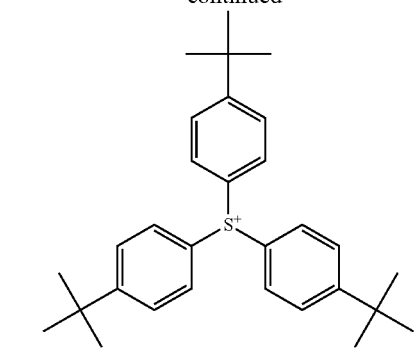
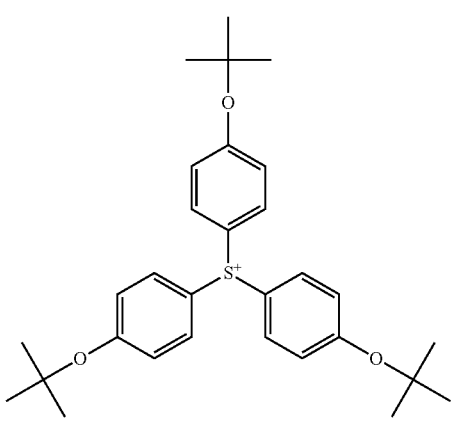
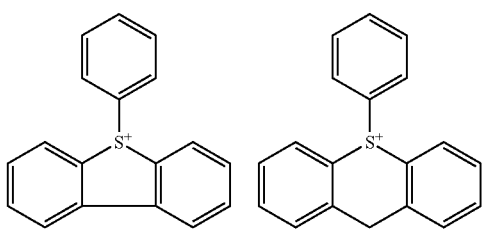
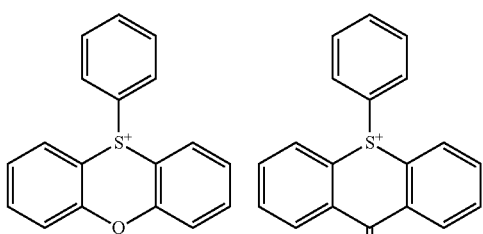
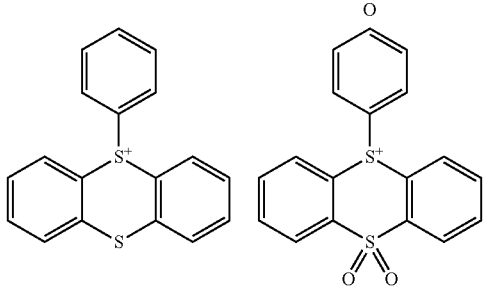
-continued
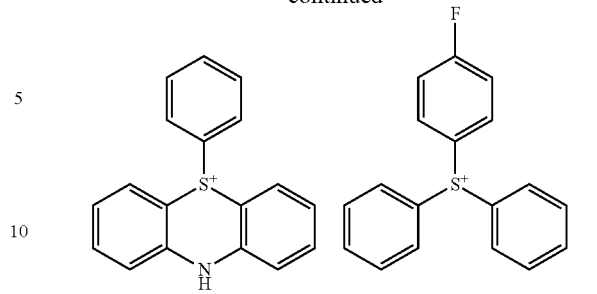
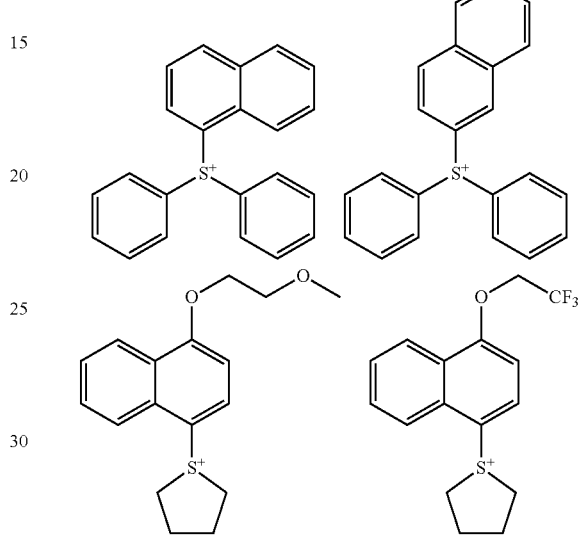
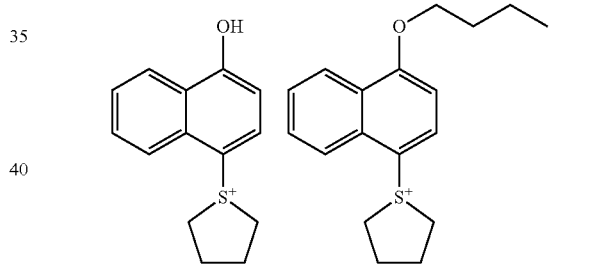
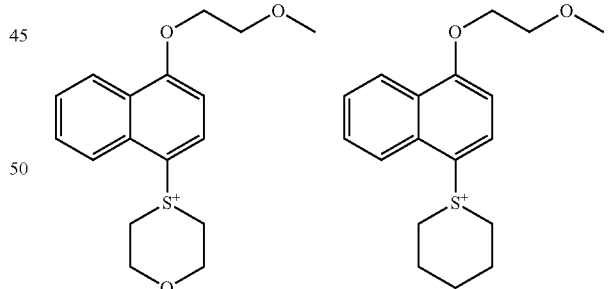
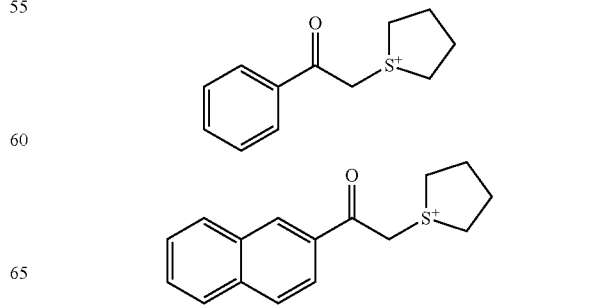

-continued

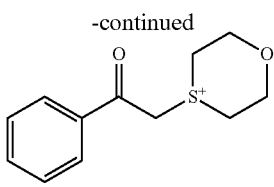

It is also possible to blend any polymers of conventional type wherein the exposed region is dissolved on alkaline development, such as (meth)acrylate polymers, polynorbornene, cycloolefin-maleic anhydride copolymers, and ring-opening metathesis polymerization (ROMP) polymers.

In the polymer used as the base resin (B), preferably units (UN-1), (UN-2) and (UN-3) and optional units (UN-4) and (UN-5) account for at least 60 mol % based on the entire monomeric units of the base resin because this range ensures to formulate a chemically amplified resist composition having satisfactory properties. More preferably units (UN-1) to (UN-5) account for at least 70 mol %, especially at least 85 mol % based on the entire monomeric units.

When the entire constituent units of the base resin are recurring units selected from formulae (UN-1) to (UN-5), high etch resistance and high resolution are available in a compatible manner. In the base resin (B), recurring units other than the units (UN-1) to (UN-5) may be incorporated. For example, (meth)acrylate units protected with a conventional acid labile group and/or (meth)acrylate units having an adhesive group such as lactone structure may be used. Characteristics of a resist film may be finely adjusted by incorporating such additional recurring units although the additional recurring units are optional.

Specifically, the polymer as the base resin preferably comprises 25 to 95 mol %, more preferably 40 to 80 mol % of recurring units having formula (UN-1), 5 to 70 mol %, more preferably 10 to 60 mol % of recurring units having formulae (UN-2) and (UN-3), 0 to 30 mol %, more preferably 3 to 20 mol % of recurring units having formulae (UN-4) and (UN-5); 0 to 20 mol %, more preferably 0.5 to 20 mol %, even more preferably 1 to 10 mol % of recurring units having formulae (a1) to (a3) when an acid generator is blended, or 0.5 to 20 mol %, more preferably 1 to 10 mol % of recurring units having formulae (a1) to (a3) when no acid generator is blended; and 0 to 20 mol %, more preferably 0 to 10 mol % of additional recurring units.

The base resin (B) may be prepared by any well-known techniques, by selecting suitable monomers and effecting copolymerization while optionally combining protection and deprotection reactions. The copolymerization reaction is preferably radical or anionic polymerization though not limited thereto. Reference may be made to JP-A 2004-115630.

The base resin (B) preferably has a weight average molecular weight (Mw) of 2,000 to 50,000, and more preferably 3,000 to 20,000, as measured versus polystyrene standards by GPC using THF solvent. A polymer with a Mw of at least 2,000 avoids the phenomenon that a pattern is rounded at the top, reduced in resolution, and degraded in LER. If Mw is greater than the necessity, there is a tendency of increasing LER, depending on a particular pattern to be resolved. The polymer is preferably controlled to a Mw of up to 50,000, more preferably to a Mw of up to 20,000 particularly when a pattern with a line width of up to 100 nm is to be formed.

The base resin (B) should preferably have a dispersity (Mw/Mn) of 1.0 to 2.0, especially 1.0 to 1.8.

It is acceptable to use a blend of two or more inventive polymers which are different in compositional ratio, molecular weight or dispersity, or a blend of an inventive polymer and a polymer free of units having formula (UN-1).

C. Acid Generator

Component (C) included in the resist film is an acid generator. The acid generator may be a compound (photoacid generator or PAG) which generates an acid in response to actinic ray or radiation, or a compound (thermal acid generator) which generates an acid upon receipt of heat. While the PAG used herein is not particularly limited, suitable PAGs include sulfonium salts, iodonium salts, sulfonyldiazomethane, N-sulfonyloxyimide, and oxime-O-sulfonate acid generators, which may be used alone or in admixture.

Examples of the PAG include those described in JP-A 2008-111103, paragraphs [0122] to [0142], and JP-A 2005-326833 (U.S. Pat. Nos. 7,537,880 and 7,288,363). Of these PAGs, PAGs of arylsulfonate or alkanesulfonate type are preferred because they generate acids having an appropriate acidity to cause the acid-eliminatable group on the recurring unit of formula (UN-2) to undergo elimination reaction for inducing alkali insolubilization and crosslinking reaction between polymer molecules.

Instead of the PAG, a polymer comprising recurring units selected from sulfonium salt units (a1) to (a3) may be used. Using such a polymer as PAG, a pattern of good profile may be formed because acid diffusion is suppressed to a high degree.

The acid generator (C) is preferably used in an amount of 0.1 to 40 parts, more preferably 1 to 20 parts by weight per 100 parts by weight of the base resin (B).

D. Basic Compound

Component (D) included in the resist film is a basic compound. The basic compound is effective for controlling acid diffusion. Even when the resist film is applied to a substrate having an outermost surface layer made of a chromium-containing material, the basic compound is effective for minimizing the influence of the acid generated in the resist film on the chromium-containing material.

Numerous basic compounds are known useful including primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts. Examples are described in JP-A 2008-111103 (U.S. Pat. No. 7,537,880) and JP-A 2001-166476, for example, and any such compounds are useful. The basic compounds may be used alone or in admixture.

Of the foregoing basic compounds, preferred are tris[2-(methoxymethoxy)ethyl]amine, tris[2-(methoxymethoxy)ethyl]amine-N-oxide, morpholine derivatives and imidazole derivatives.

The basic compound (D) is preferably used in an amount of 0.01 to 5 parts, more preferably 0.05 to 3 parts by weight per 100 parts by weight of the base resin (B).

Resist Composition

To enable formation of a resist film containing the aforementioned components, the components are dissolved in an organic solvent to form a resist composition. The organic solvent used to form a resist composition solution may be any organic solvent in which components (A) to (D) and additives are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, PGMEA, ethyl lactate, and mixtures thereof because the acid generator is most soluble therein.

An appropriate amount of the organic solvent used is 200 to 3,000 parts, especially 400 to 2,500 parts by weight per 100 parts by weight of the base resin (B).

In the resist composition, any of surfactants commonly used for improving coating characteristics may be added as an optional component. Numerous surfactants are known in the art including those described in JP-A 2004-115630, for example. A choice may be made with reference to such patent documents. An appropriate amount of the surfactant used is up to 2 parts, preferably up to 1 part, and at least 0.01 part by weight per 100 parts by weight of the base resin (B).

The above-described components are dissolved in an organic solvent to form a resist composition solution which is filtered and then applied to a workpiece to form a resist film thereon. Typical of the workpiece is a photomask blank in which a photomask substrate (e.g., transparent quartz substrate) is covered with a suitable film, typically a light-shielding film containing a metal (e.g., transition metal or silicon) and optionally at least one light element selected from oxygen, nitrogen and carbon. The resist composition solution is applied to the photomask blank so as to give a dry coating of 0.05 to 2.0 μm thick by any of well-known application techniques including spin coating, roll coating, flow coating, dip coating, spray coating, and doctor coating. The coating is prebaked on a hot plate at 60 to 150° C. for 30 seconds to 20 minutes, and preferably at 80 to 140° C. for 5 to 15 minutes in the case of photomask blanks, for removing the unnecessary solvent and yielding the resist film.

Antistatic Film

In a preferred embodiment, the photomask blank includes an antistatic film on the resist film. An electroconductive polymer is typically used in the antistatic film. Examples thereof include, but are not limited to, composites composed of a π-conjugated electroconductive polymer and a polyanion containing polyacid, and π-conjugated electroconductive polymers having an acidic group and/or salt on side chain of recurring units.

Examples of the n-conjugated electroconductive polymer used herein include polyaniline, polypyrrole, polythiophene, polyacetylene, polyphenylene, polyphenylene vinylene, polyacene, and polythiophene vinylene derivatives, as well as copolymers of constituent monomers thereof.

Of these, polyanilines are preferred because of their advantages including dispersion in water, filtration of dispersion, stripping of the resulting film with water or alkaline developer, low defectiveness in lithography, ease of polymerization, low re-agglomeration during storage, and stability in air. The aniline based electroconductive polymers are organic polymers whose backbone is composed of aniline or aniline derivatives excluding para-substituted ones.

Although the aniline based electroconductive polymers are fully conductive in unsubstituted form, it is preferred to introduce a substituent group therein, from the aspects including dispersion in water, low re-agglomeration, filtration of dispersion, stripping of the resulting film with water or alkaline developer, and low defectiveness in lithography. Suitable substituent groups include straight or branched $C_1$-$C_{20}$ monovalent hydrocarbon groups, in which some or all carbon-bonded hydrogen atoms may be substituted by functional groups such as halogen atoms, alkyl, carboxyl, alkoxy, hydroxy, cyano, and acidic groups or salts thereof, or a heteroatom such as oxygen, sulfur or nitrogen may intervene in a carbon-carbon bond.

Examples of the aniline monomers used to form the aniline based electroconductive polymers include aniline, 2-methylaniline, 3-methylaniline, 2-ethylaniline, 3-ethylaniline, 2-isopropylaniline, 2-t-butylaniline, 2,3-dimethylaniline, 2,5-dimethylaniline, 2,6-dimethylaniline, 3,5-dimethylaniline, 2,6-diethylaniline, 2,6-diisopropylaniline, 2,3,5,6-tetramethylaniline, 2-methoxyaniline, 3-methoxyaniline, 2-ethoxyaniline, 3-ethoxyaniline, 3-isopropoxyaniline, 3-hydroxyaniline, 2,5-dimethoxyaniline, 2,6-dimethoxyaniline, 3,5-dimethoxyaniline, 2,5-diethoxyaniline, 2-methoxy-5-methylaniline, 5-t-butyl-2-methoxyaniline, 2-chloro-5-methylaniline, 2-chloro-6-methylaniline, 3-chloro-2-methylaniline, and 5-chloro-2-methylaniline.

When composites of polyaniline with polyanion are evaluated with respect to dispersion in water, electroconductivity, reactivity, and thermal stability, preference is given to (co)polymers obtained from such monomers as 2-methylaniline, 3-methylaniline, 2-ethylaniline, 3-ethylaniline, 2-isopropylaniline, 2-methoxyaniline, 3-methoxyaniline, 2-ethoxyaniline, 3-ethoxyaniline, 3-isopropoxyaniline, and 3-hydroxyaniline.

Examples of the polythiophene include polythiophene, poly(3-methylthiophene), poly(3-ethylthiophene), poly(3-propylthiophene), poly(3-butylthiophene), poly(3-hexylthiophene), poly(3-heptylthiophene), poly(3-octylthiophene), poly(3-decylthiophene), poly(3-dodecylthiophene), poly(3-octadecylthiophene), poly(3-bromothiophene), poly(3-chlorothiophene), poly(3-iodothiophene), poly(3-cyanothiophene), poly(3-phenylthiophene), poly(3,4-dimethylthiophene), poly(3,4-dibutylthiophene), poly(3-hydroxythiophene), poly(3-methoxythiophene), poly(3-ethoxythiophene), poly(3-butoxythiophene), poly(3-hexyloxythiophene), poly(3-heptyloxythiophene), poly(3-octyloxythiophene), poly(3-decyloxythiophene), poly(3-dodecyloxythiophene), poly(3-octadecyloxythiophene), poly(3,4-dihydroxythiophene), poly(3,4-dimethoxythiophene), poly(3,4-diethoxythiophene), poly(3,4-dipropoxythiophene), poly(3,4-dibutoxythiophene), poly(3,4-dihexyloxythiophene), poly(3,4-diheptyloxythiophene), poly(3,4-dioctyloxythiophene), poly(3,4-didecyloxythiophene), poly(3,4-didodecyloxythiophene), poly(3,4-ethylenedioxythiophene), poly(3,4-propylenedioxythiophene), poly(3,4-butenedioxythiophene), poly(3-methyl-4-methoxythiophene), poly(3-methyl-4-ethoxythiophene), poly(3-carboxythiophene), poly(3-methyl-4-carboxythiophene), poly(3-methyl-4-carboxyethylthiophene), and poly(3-methyl-4-carboxybutylthiophene).

Examples of the polypyrrole include polypyrrole, poly(N-methylpyrrole), poly(3-methylpyrrole), poly(3-ethylpyrrole), poly(3-n-propylpyrrole), poly(3-butylpyrrole), poly (3-octylpyrrole), poly(3-decylpyrrole), poly(3-dodecylpyrrole), poly(3,4-dimethylpyrrole), poly(3,4-dibutylpyrrole), poly(3-carboxypyrrole), poly(3-methyl-4-carboxypyrrole), poly(3-methyl-4-carboxyethylpyrrole), poly(3-methyl-4-carboxybutylpyrrole), poly(3-hydroxypyrrole), poly(3-methoxypyrrole), poly(3-ethoxypyrrole), poly(3-butoxypyrrole), poly(3-hexyloxypyrrole), poly(3-methyl-4-hexyloxypyrrole), and poly(3-methyl-4-hexyloxypyrrole).

Examples of the aniline monomer having an acidic group and/or salt on side chain of recurring unit are described in JP-A 2014-015550, paragraphs [0019] to [0024].

Examples of the thiophene monomer having an acidic group and/or salt on side chain of recurring unit are described in JP-A 2014-028759, paragraphs [0055] to [0067] and JP-A 2014-028760, paragraphs [0049] to [0054] (WO 2014/007299).

The foregoing monomers may be used alone or in admixture.

The polyanion used herein is a polymer having a plurality of anion groups in the molecule, which may be obtained by polymerizing an anion group-bearing monomer, or by copolymerizing an anion group-bearing monomer with an anion group-free monomer. The monomers may be used alone or in admixture. A polyanion may also be obtained by once forming an anion group-free polymer and sulfonating it with a sulfonating agent such as sulfuric acid, fuming sulfuric acid or sulfamic acid. Further, by once forming an anion group-bearing polymer and sulfonating it, there may be obtained a polyanion having more anion groups.

Examples of the monomer from which the polyanion is constituted include monomers having a strong acid group such as $-O-SO_3^-H^+$, $-SO_3^-H^+$, $-CH(CF_3)-CF_2-SO_3^-H^+$, $-CF_2-SO_3^-H^+$, $-COO^-H^+$, $-O-PO_4^-H^+$, or $-PO_4^-H^+$. Of these, $-SO_3^-H^+$, $-CH(CF_3)-CF_2-SO_3^-H^+$, $-CF_2-SO_3^-H^+$, and $-COO^-H^+$ are preferred for doping of the π-conjugated electroconductive polymer therewith. Also preferably, the anion group is positioned contiguous to or spaced apart from the main chain of polyanion.

Examples of the monomer having a sulfonic acid group include styrenesulfonic acid, allyloxybenzenesulfonic acid, methallyloxybenzenesulfonic acid, vinylsulfonic acid, allylsulfonic acid, methallylsulfonic acid, 2-(methacryloxy)ethanesulfonic acid, 4-(methacryloxy)butanesulfonic acid, isoprenesulfonic acid, 2-acrylamide-2-methylpropanesulfonic acid, 1,1,3,3,3-pentafluoro-2-methacryloyloxypropane-1-sulfonic acid, 1,1-difluoro-2-methacryloyloxyethanesulfonic acid, 1,1,3,3,3-pentafluoro-2-(4-vinylbenzoyloxy)propane-1-sulfonic acid, 1,1-difluoro-2-(4-vinylbenzoyloxy)ethanesulfonic acid, and benzyltrimethylammonium difluorosulfoacetic acid 2-methacryloyloxyethyl ester. The monomers may be used alone or in admixture.

Examples of the monomer having a phosphoric acid group include 3-chloro-2-acid phosphoxypropyl (meth)acrylate, acid phosphoxypolyoxyethylene glycol mono(meth)acrylate, mono(2-hydroxyethyl acrylate)acid phosphate, mono(2-hydroxyethyl methacrylate)acid phosphate, mono(2-hydroxypropyl acrylate)acid phosphate, mono(2-hydroxypropyl methacrylate)acid phosphate, mono(3-hydroxypropyl acrylate)acid phosphate, mono(3-hydroxypropyl methacrylate)acid phosphate, diphenyl-2-acryloyloxyethyl phosphate, and diphenyl-2-methacryloyloxyethyl phosphate.

Examples of the monomer having a carboxyl group include ethylenically unsaturated monocarboxylic acids such as acrylic acid, methacrylic acid, and crotonic acid, ethylenically unsaturated polycarboxylic acids and acid anhydrides such as maleic acid, fumaric acid, and itaconic acid, and partially esterified products of ethylenically unsaturated polycarboxylic acids such as methyl maleate and methyl itaconate.

The anion group-free monomer which is copolymerizable with the anion group-bearing monomer may be any of well-known compounds. Examples include conjugated diene monomers such as 1,3-butadiene, isoprene, 2-chloro-1,3-butadiene, and 2-methyl-1,3-butadiene; aromatic vinyl monomers such as styrene, α-methylstyrene and p-methylstyrene; ethylenically unsaturated carboxylic acid alkyl ester monomers such as methyl (meth)acrylate, ethyl (meth)acrylate, butyl (meth)acrylate, and 2-ethylhexyl (meth)acrylate; ethylenically unsaturated carboxylic acid amide monomers such as acrylamide, methacrylamide, N,N-dimethylacrylamide, and N-methylolacrylamide; ethylenically unsaturated carboxylic acid hydroxyalkyl ester monomers such as hydroxyalkyl (meth)acrylates and glycerol di(meth)acrylate; carboxylic acid vinyl ester monomers such as vinyl acetate; (meth)acrylonitrile, N-vinylpyrrolidone, (meth)acryloylmorpholine, cyclohexylmaleimide, isopropylmaleimide, and glycidyl (meth)acrylate.

The polyanion used herein may be obtained by adding an initiator to the above monomer(s) and letting them polymerize. The monomers may be used alone or in admixture.

JP-A 2008-133448 and JP-A 2010-077404 propose an acid generator in the form of a polymeric sulfonium salt capable of generating a sulfonic acid which is fluorinated at α-position. While a sulfonium salt of α-fluorinated sulfonic acid bound to a polymer backbone is decomposed via photolysis to generate a sulfonic acid which is a super-strong acid with minimal diffusion, the polyanion may be obtained by homo- or co-polymerizing recurring units containing the sulfonium salt. When the polymeric sulfonium salt is an alkali metal salt, ammonium salt or amine salt, its solution is preferably made acidic by previously adding an inorganic or organic acid such as sulfuric acid, hydrochloric acid, nitric acid, phosphoric acid or perchloric acid or using a cation exchange resin.

Further, the polyanion may be obtained by polymerizing styrene, methylstyrene or the like, and sulfonating the polymer with a sulfonating agent such as sulfuric acid, fuming sulfuric acid or sulfamic acid. The polyanions may also be obtained from sulfonation of polyether ketone (EP 0041780), sulfonation of polyether ether ketone (JP-A 2008-108535), sulfonation of polyether sulfone (JP-A H10-309449), sulfonation of polyphenylene, polyfluorene or polyvinylcarbazole (JP-A 2010-514161), sulfonation of polyphenylene oxide, and sulfonation of polyphenylene sulfide.

Of the foregoing polyanions, preferred from the aspects of solvent solubility and electroconductivity are polyisoprenesulfonic acid,
copolymers containing polyisoprenesulfonic acid,
polysulfoethyl methacrylate,
copolymers containing polysulfoethyl methacrylate,
poly(4-sulfobutyl methacrylate),
copolymers containing poly(4-sulfobutyl methacrylate),
polymethallyloxybenzene sulfonic acid,
copolymers containing polymethallyloxybenzene sulfonic acid,
polystyrene sulfonic acid,
copolymers containing polystyrene sulfonic acid,
copolymers containing poly(1,1,3,3,3-pentafluoro-2-methacryloyloxypropane-1-sulfonic acid),
copolymers containing poly(1,1-difluoro-2-methacryloyloxyethanesulfonic acid, copolymers containing poly(1,1,3,3,3-pentafluoro-2-(4-vi-nylbenzoyloxy)propane-1-sulfonic acid),
copolymers containing poly(1,1-difluoro-2-(4-vinylben-zoyl-oxy)ethanesulfonic acid), and
copolymers containing polydifluorosulfoacetic acid 2-meth-acryloyloxyethyl ester.

More preferred are polystyrene sulfonic acid,
poly(1,1,3,3,3-pentafluoro-2-methacryloyloxypropane-1-sulfonic acid),
copolymers containing poly(1,1-difluoro-2-methacryloy-loxyethanesulfonic acid),
copolymers containing poly(1,1,3,3,3-pentafluoro-2-(4-vi-nyl-benzoyloxy)propane-1-sulfonic acid),
copolymers containing poly(1,1-difluoro-2-(4-vinyl-ben-zoyloxy)ethanesulfonic acid),
polydifluorosulfoacetic acid 2-methacryloyloxyethyl ester,
polysulfoethyl methacrylate, and
poly(4-sulfobutyl methacrylate).

With respect to degree of polymerization, the polyanion preferably contains 10 to 100,000 monomeric units, and it is more preferred from the aspects of solvent solubility and electroconductivity that the polyanion contain 50 to 10,000 monomeric units. The polyanion preferably has a Mw of 5,000 to 1,000,000. If Mw is below the lower limit, the π-conjugated electroconductive polymer is sometimes unlikely to form a uniform solution. If Mw is above the upper limit, electroconductivity may be worsened.

The antistatic film may contain an amino acid. The amino acid used herein preferably has the formula (8).

(8)

Herein $R^{101}$ and $R^{102}$ are each independently hydrogen or a straight, branched or cyclic $C_1$-$C_{20}$ monovalent hydrocarbon group which may be separated by a heteroatom. $R^{103}$ and $R^{104}$ are each independently hydrogen or a straight, branched or cyclic $C_1$-$C_{20}$ monovalent hydrocarbon group which may be separated by a heteroatom. A pair of $R^{101}$ and $R^{103}$ or $R^{101}$ and $R^{104}$ may bond together to form a ring with the carbon and nitrogen atoms to which they are attached. L″ is a straight, branched or cyclic $C_1$-$C_{20}$ divalent hydrocarbon group which may be separated by a heteroatom.

Examples of the amino acid having formula (8) are given below, but not limited thereto.

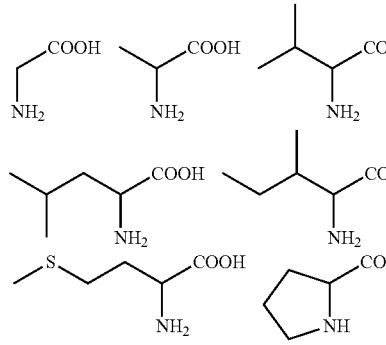

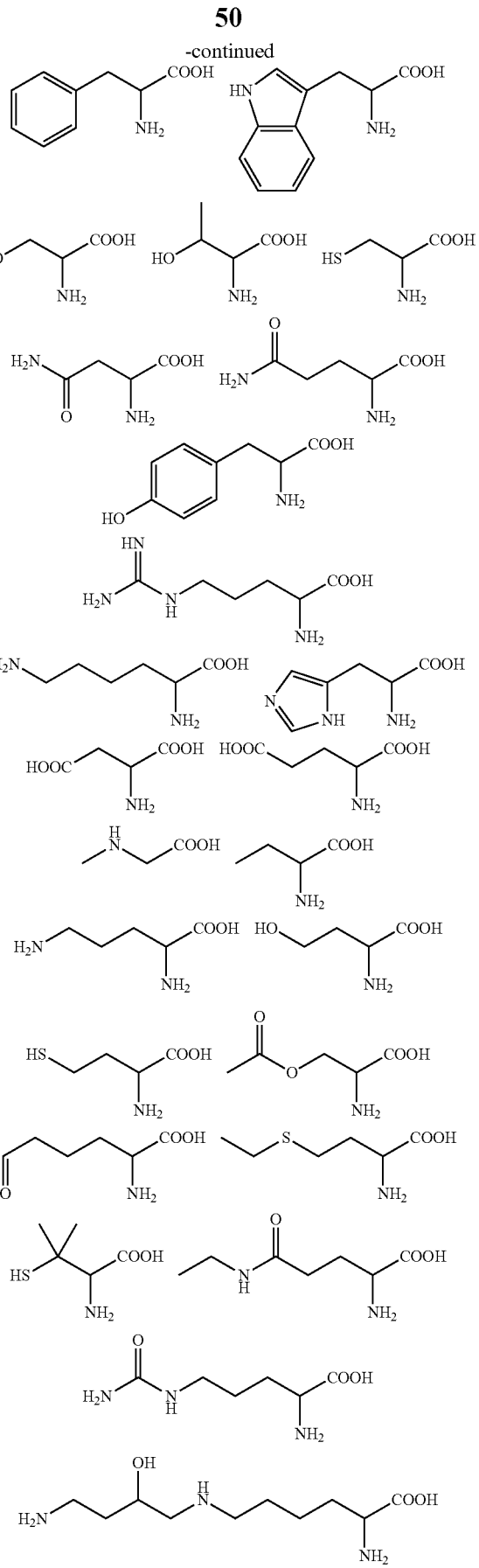

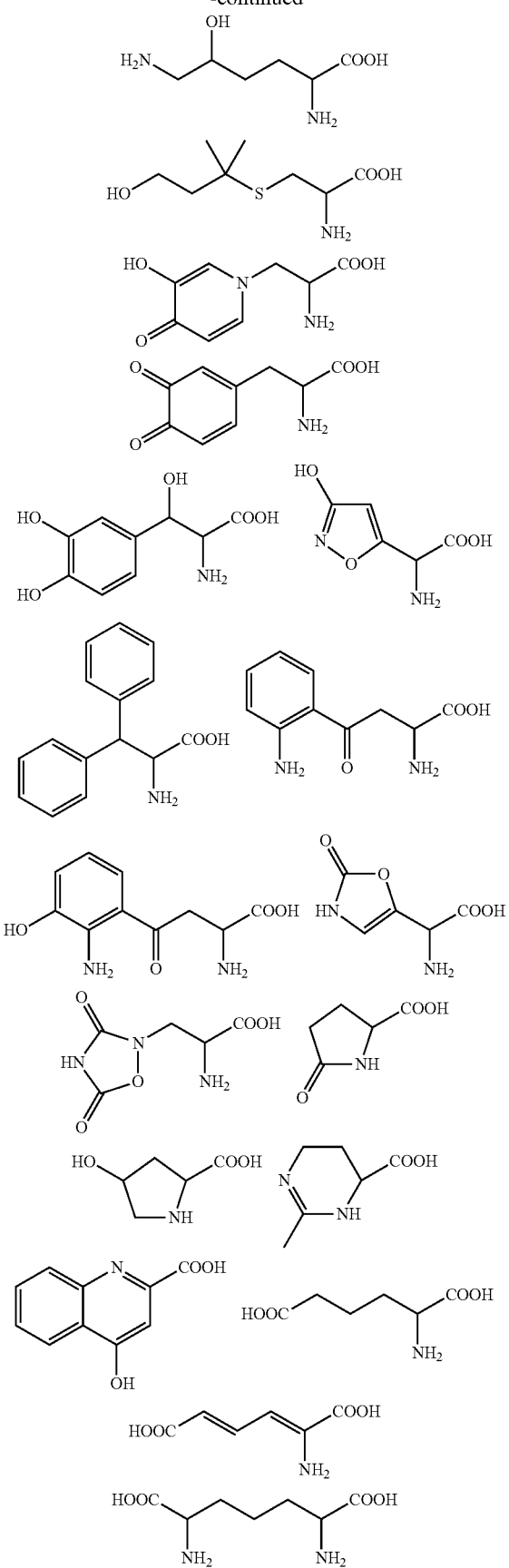
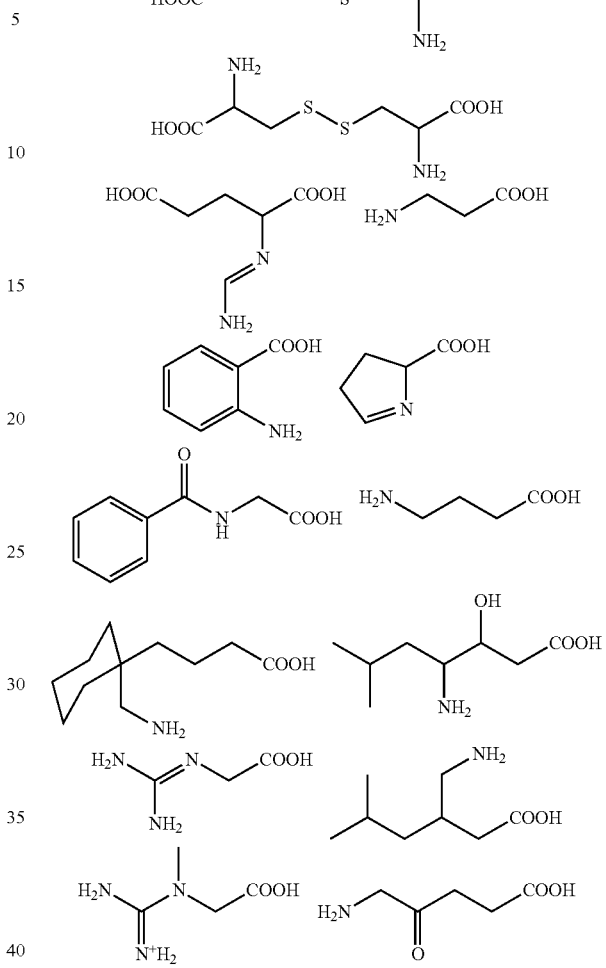

When the antistatic film contains an amino acid, the amount of the amino acid is preferably 1 to 50 parts, more preferably 3 to 10 parts by weight per 100 parts by weight of the electroconductive polymer.

Antistatic Film-Forming Composition

To enable formation of an antistatic film, the aforementioned component is dissolved in a solvent to form an antistatic film-forming composition.

The solvent used herein may be water or a mixture of water and an organic solvent. The organic solvent is preferably a water-miscible solvent in which the electroconductive polymer may be dissolved or dispersed. Exemplary of the organic solvent are polar solvents such as N-methyl-2-pyrrolidone, N,N'-dimethylformamide, N,N'-dimethylacetamide, dimethyl sulfoxide, and hexamethylphosphortriamide; alcohols such as methanol, ethanol, propanol, and butanol; polyhydric aliphatic alcohols such as ethylene glycol, propylene glycol, dipropylene glycol, 1,3-butylene glycol, 1,4-butylene glycol, D-glucose, D-glucitol, isoprene glycol, butanediol, 1,5-pentanediol, 1,6-hexanediol, 1,9-nonanediol, and neopentyl glycol; carbonates such as ethylene carbonate and propylene carbonate; cyclic ethers such as dioxane and tetrahydrofuran; linear ethers such as dialkyl ethers, ethylene glycol monoalkyl ethers, ethylene glycol dialkyl ethers, propylene glycol monoalkyl ethers, propylene glycol dialkyl ethers, polyethylene glycol dialkyl ethers, and polypropylene glycol dialkyl ethers; heterocyclic compounds such as 3-methyl-2-oxazolidinone; and nitrile compounds such as acetonitrile, glutaronitrile, methoxyacetonitrile, propionitrile, and benzonitrile. These solvents may be used alone or in admixture. The water-miscible solvent is mixed with water in an amount of up to 50% by weight of the mixture.

An appropriate amount of the electroconductive polymer in the antistatic film-forming composition is 0.05 to 10.0% by weight. At least 0.05 wt % of the conductive polymer provides the composition with sufficient conductivity. A uniform conductive film is readily formed when the amount of the conductive polymer is up to 10.0 wt %, especially up to 5.0 wt %.

A surfactant may be added to the antistatic film-forming composition to make the composition more wettable to a workpiece or substrate. The preferred surfactants are nonionic ones. Examples include polyoxyethylene alkyl ethers, polyoxyethylene alkyl phenyl ethers, polyoxyethylene carboxylic acid esters, sorbitan esters, polyoxyethylene sorbitan esters, and acetylene glycol.

An appropriate amount of the surfactant used is 1 to 50 parts, more preferably 2 to 20 parts by weight per 100 parts by weight of the composite of polyaniline based electroconductive polymer and polyanion. If the amount of the surfactant is at or above the lower limit, the composition is wettable to the resist surface. If the amount of the surfactant is at or below the upper limit, the antistatic effect is not affected.

The antistatic film-forming composition may be prepared, for example, by mixing the composite of n-conjugated electroconductive polymer and polyanion, additive, solvent, and optionally surfactant, adjusting pH and optionally filtering through a filter.

Resist Pattern Forming Process

The resist film containing component (A) has the advantage that it is amenable to the lithography of irradiating high-energy radiation to a resist film in the absence of liquid. Examples of the high-energy radiation include EB, x-ray, excimer laser light, γ-ray, and synchrotron radiation. Of course, advantages are obtained in the lithography using a photomask. The resist film is particularly advantageous when combined with such lithography processes as irradiation in vacuum and irradiation of high-energy beam, but excluding the immersion lithography. A typical lithography process is EB lithography.

The process of forming a resist pattern by exposing the resist film to a pattern of radiation, followed by post treatment and development is known from numerous publications including the patent documents cited herein. The process of the invention may be carried out in accordance with these teachings.

For example, in the processing of a photomask blank using EB, a resist film and optionally an antistatic film are formed on a photomask blank by the above-mentioned procedure. Thereafter, using an EB exposure system, EB is irradiated to the region of the resist film where the underlying film such as a light-shielding film is to be removed. While the exposure dose may be adjusted as appropriate by controlling the amounts of photoacid generator and basic compound added, an exposure dose of about 0.1 to 20 μC/cm² is generally preferred, with an exposure dose of about 3 to 10 μC/cm² being more preferred.

Although the film thickness is not particularly limited, it is preferred that the resist film have a thickness of 0.01 to 5.0 μm, more preferably 0.05 to 2.0 μm, and the antistatic film have a thickness of 0.005 to 0.5 μm, more preferably 0.02 to 0.3 μm.

After the pattern exposure, the photomask blank is baked (PEB) on a hot plate at 60 to 150° C. for 1 to 20 minutes, and preferably at 80 to 120° C. for 1 to 10 minutes.

This is followed by development in an aqueous alkaline developer. Development is typically carried out in an aqueous solution of 0.1 to 5 wt %, preferably 2 to 3 wt % tetramethylammonium hydroxide (TMAH) for 0.1 to 3 minutes, preferably 0.5 to 2 minutes by a conventional technique such as dip, puddle or spray technique. In this way, a desired resist pattern is formed.

Photomask Preparing Method

In processing the photomask blank having a resist pattern formed thereon to form a photomask, either wet etching or dry etching may be used, with dry etching being preferred because a photomask with a higher accuracy is obtained. With respect to the dry etching of photomask blanks, a number of techniques are already known as disclosed in JP-A 2006-078807 and JP-A 2006-140635, for example. For a film of a chromium compound, for example, oxygen-containing chlorine dry etching is generally used. For a film of a silicon compound, transition metal-containing silicon compound or tantalum compound, fluorine dry etching is generally used.

EXAMPLE

Synthesis Examples, Preparation Examples, Examples, Reference Examples, and Comparative Examples are given below for further illustrating the invention although the invention is not limited thereto. Mw is a weight average molecular weight as measured versus polystyrene standards by GPC using THF solvent. The compositional ratio of a polymer was analyzed by ¹H-NMR.

Polymerizable monomers (Monomers 1 to 6) used in Synthesis Examples have the following structural formulae.

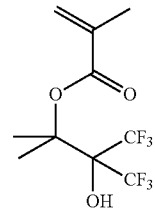

Monomer 1

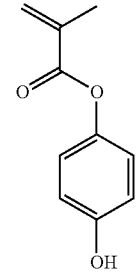

Monomer 2

Monomer 3

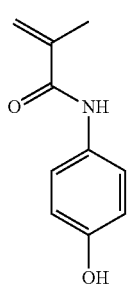

Monomer 4

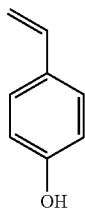

Monomer 5

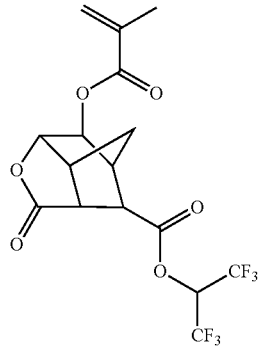

Monomer 6

Monomers 1, 2, 4 and 5 were synthesized according to the teaching of JP-A 2007-204385, JP-A 2007-204448, JP-A 2012-032762, and JP-A 2008-111103. Monomers 3 and 6 are commercially available from Tokyo Chemical Industry Co., Ltd.

Synthesis Example 1

Synthesis of Polymer A1

In nitrogen atmosphere, 87 g of Monomer 1, 13 g of Monomer 2, and 4.3 g of dimethyl 2,2'-azobisisobutyrate were dissolved in 155 g of a 7/3 mixture of methyl ethyl ketone (MEK) and toluene. With stirring at 80° C. in nitrogen atmosphere, the solution was added dropwise to 78 g of a 7/3 mixture of MEK and toluene over 4 hours. At the end of dropwise addition, the solution was aged at 80° C. for 2 hours. The polymerization solution was cooled to room temperature and added dropwise to 1,500 g of hexane. The solid precipitate was filtered, washed with 600 g of hexane, and vacuum dried at 60° C. for 20 hours, obtaining a polymer in white powder solid form. The polymer having the following formula is designated Polymer A1. Amount 70 g, yield 70%.

Polymer A1

(a = 0.80, b = 0.20, Mw = 6,000)

Synthesis Examples 2, 3 and Comparative Synthesis Examples 1, 2

Synthesis of Polymers A2, A3 and Comparative Polymers A4, A5

Polymers A2, A3 and Comparative Polymers A4, A5 were synthesized by the same procedure as in Synthesis Example 1 aside from changing the type and ratio of monomers and the ratio of solvent mixture.

Polymer A2

(a = 0.80, b = 0.20, Mw = 6,400)

Polymer A3

(a = 0.80, b = 0.20, Mw = 6,500)

-continued

Comparative Polymer A4

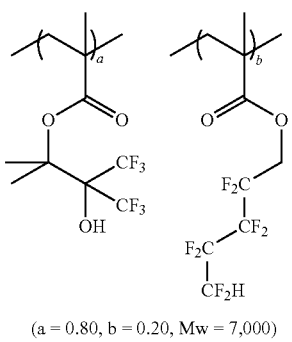

(a = 0.80, b = 0.20, Mw = 7,000)

Comparative Polymer A5

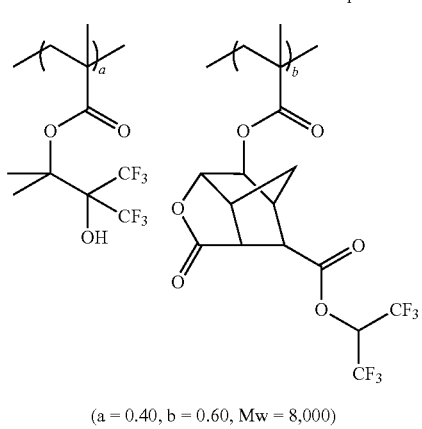

(a = 0.40, b = 0.60, Mw = 8,000)

Polymer P1

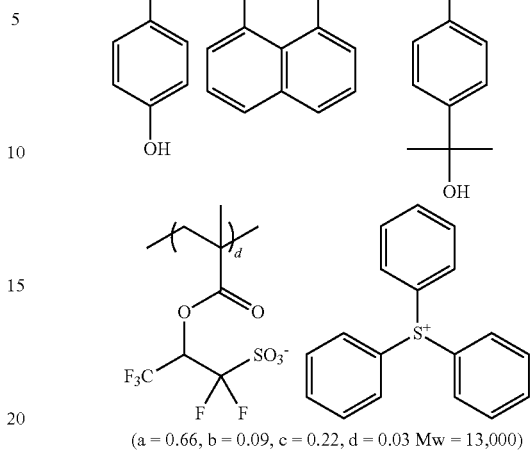

(a = 0.66, b = 0.09, c = 0.22, d = 0.03 Mw = 13,000)

Synthesis Example 4

Synthesis of Polymer P1

In nitrogen atmosphere, 890 g of 50.0 wt % PGMEA solution of 4-hydroxystyrene, 47.7 g of acenaphthylene, 169.6 g of 4-(2-hydroxy-2-propyl)styrene, 87.0 g of triphenylsulfonium 1,1,3,3,3-pentafluoro-2-methacryloyloxypropane-1-sulfonate, 96.1 g of dimethyl 2,2'-azobis(2-methylpropionate) (V-601 by Wako Pure Chemical Industries, Ltd.), and 360 g of γ-butyrolactone and 220 g of PGMEA as solvent were fed into a 3000-mL dropping cylinder to form a monomer solution. In nitrogen atmosphere, a 5000-mL polymerization flask was charged with 580 g of γ-butyrolactone, which was heated at 80° C. The monomer solution was added dropwise from the dropping funnel to the flask over 4 hours. After the completion of dropwise addition, the polymerization solution was continuously stirred for 18 hours while maintaining its temperature at 80° C. The polymerization solution was cooled to room temperature and added dropwise to 22.5 kg of diisopropyl ether whereupon the copolymer agglomerated. Diisopropyl ether was decanted off, and the copolymer was dissolved in 2,250 g of acetone. The acetone solution was added dropwise to 22.5 kg of diisopropyl ether whereupon the copolymer precipitated. The copolymer precipitate was collected by filtration and dissolved in 2,250 g of acetone again. The acetone solution was added dropwise to 22.5 kg of water. The copolymer precipitate was collected by filtration and dried at 40° C. for 40 hours, obtaining 700 g of a white polymer. The polymer designated Polymer P1 was analyzed by $^{13}$C-NMR, $^{1}$H-NMR and GPC, with the results shown below.

Synthesis Example 5

Synthesis of Polymer B1

In nitrogen atmosphere, 39.26 g of 4-acetoxystyrene, 6.14 g of acenaphthylene, 19.6 g of 4-(2-hydroxy-2-propyl)styrene, 7.43 g of dimethyl 2,2'-azobis(2-methylpropionate) (V-601 by Wako Pure Chemical Industries, Ltd.), and 90 g of MEK as solvent were fed into a 200-mL dropping cylinder to form a monomer solution. In nitrogen atmosphere, a 500-mL polymerization flask was charged with 60 g of MEK, which was heated at 80° C. The monomer solution was added dropwise from the dropping funnel to the flask over 4 hours. After the completion of dropwise addition, the polymerization solution was continuously stirred for 18 hours while maintaining its temperature at 80° C. The polymerization solution was cooled to room temperature and added dropwise to 1,000 g of hexane whereupon the copolymer precipitated. The copolymer precipitate was collected by filtration and washed twice with 200 g of hexane. In a 1-L flask under nitrogen atmosphere, the copolymer was dissolved in a mixture of 126 g tetrahydrofuran and 42 g methanol, to which 16.3 g of ethanolamine was added, followed by stirring at 60° C. for 3 hours. The reaction solution was concentrated under reduced pressure, the concentrate was dissolved in a mixture of 300 g ethyl acetate and 80 g water. The solution was transferred to a separatory funnel, to which 8.2 g of acetic acid was added, followed by separatory operation. After the lower layer was distilled off, the organic layer was combined with 80 g of water and 10.9 g of pyridine, followed by separatory operation. After the lower layer was distilled off, the organic layer was combined with 80 g of water, followed by water washing and separatory operation. The water washing/separatory operation was repeated 5 times in total. After separation, the organic layer was concentrated, and dissolved in 140 g of acetone. The acetone solution was added dropwise to 2,500 g of water, whereupon crystals precipitated. The crystal precipitate was filtered, washed with water, and suction filtered for 2 hours. The filter cake was dissolved in 150 g of acetone again. The acetone solution was added dropwise to 2,800 g of water, whereupon crystals precipitated. The crystal precipitate was filtered, washed with water, and dried, obtaining 45.0 g of a white polymer. The polymer designated Polymer B1 was analyzed by $^{13}$C-NMR, $^1$H-NMR and GPC, with the results shown below.

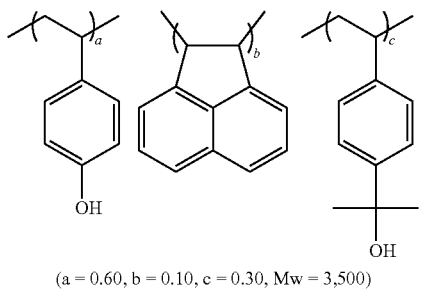

Polymer B1

(a = 0.60, b = 0.10, c = 0.30, Mw = 3,500)

Synthesis Example 6

Synthesis of Polymer B2

A polymer B2 was synthesized by the same procedure as in Synthesis Example 5 aside from using 4-chlorostyrene instead of 4-(2-hydroxy-2-propyl)styrene and indene instead of acenaphthylene.

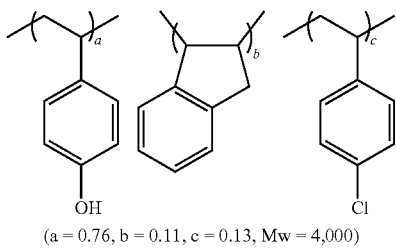

Polymer B2

(a = 0.76, b = 0.11, c = 0.13, Mw = 4,000)

Preparation Examples 1 to 18, Reference Preparation Examples 1 to 4, Comparative Preparation Examples 1 to 9

[Preparation of Resist Compositions]

Resist compositions in solution form were prepared by dissolving Polymers A1 to A3, Comparative Polymers A4, A5, Polymer P1, Polymers B1, B2, a photoacid generator, a crosslinker, and a basic compound in an organic solvent in accordance with the formulation shown in Table 1, and filtering through a filter with a pore size of 0.2 μm or a nylon or UPE filter with a pore size of 0.02 μm. The photoacid generators used are PAG-1 and 2. The crosslinker is tetramethoxymethylglycoluril (TMGU). The basic compounds are Base-1 and 2. The organic solvents are PGMEA (propylene glycol monomethyl ether acetate), PGME (propylene glycol monomethyl ether), and EL (ethyl lactate). Each composition contained 0.075 parts by weight of surfactant PF-636 (Omnova Solutions).

Base: Base-1 and Base-2

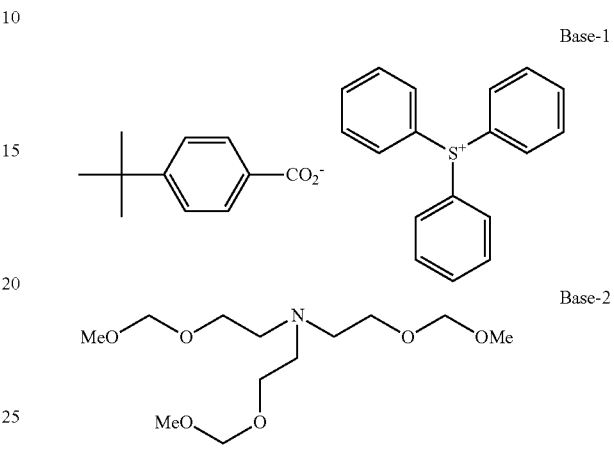

Photoacid generator: PAG-1 and PAG-2

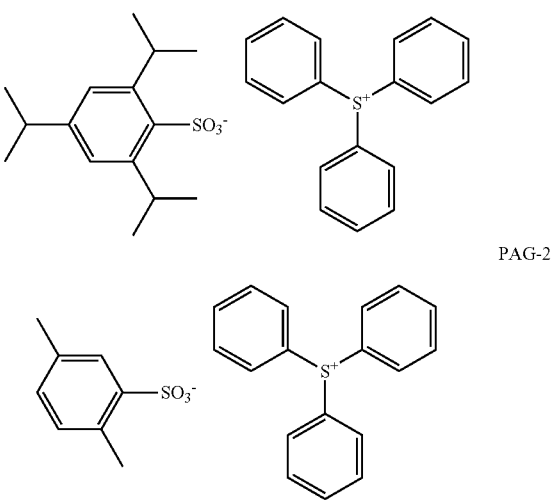

TABLE 1

| | | Resin 1 (pbw) | Resin 2 (pbw) | Photoacid generator (pbw) | Basic compound (pbw) | Fluorine-containing resin (pbw) | Cross-linker (pbw) | Solvent 1 (pbw) | Solvent 2 (pbw) | Solvent 3 (pbw) |
|---|---|---|---|---|---|---|---|---|---|---|
| Preparation Example | 1 | — | Polymer B1 (80) | PAG-1 (8) | Base-1 (2.5) | Polymer A1 (3) | — | PGMEA (1,000) | EL (2,300) | — |
| | 2 | — | Polymer B2 (80) | PAG-1(8) PAG-2(2) | Base-1 (2.5) | Polymer A1 (3) | TMGU (8) | PGMEA (1,000) | EL (2,300) | — |
| | 3 | — | Polymer B2 (80) | PAG-1 (8) | Base-2 (5.0) | Polymer A1 (3) | TMGU (8) | PGMEA (1,000) | EL (2,300) | — |
| | 4 | Polymer P1 (40) | Polymer B1 (40) | — | Base-1 (2.5) | Polymer A1 (3) | — | PGMEA (1,000) | EL (2,300) | — |

TABLE 1-continued

|  |  | Resin 1 (pbw) | Resin 2 (pbw) | Photoacid generator (pbw) | Basic compound (pbw) | Fluorine-containing resin (pbw) | Cross-linker (pbw) | Solvent 1 (pbw) | Solvent 2 (pbw) | Solvent 3 (pbw) |
|---|---|---|---|---|---|---|---|---|---|---|
|  | 5 | Polymer P1 (40) | Polymer B1 (40) | — | Base-2 (5.0) | Polymer A1 (3) | — | PGMEA (1,000) | EL (1,000) | PGME (1,300) |
|  | 6 | — | Polymer B1 (80) | PAG-1 (8) | Base-1 (2.5) | Polymer A2 (3) | — | PGMEA (1,000) | EL (2,300) | — |
|  | 7 | — | Polymer B1 (80) | PAG-1 (8) | Base-1 (2.5) | Polymer A3 (3) | — | PGMEA (1,000) | EL (2,300) | — |
|  | 8 | Polymer P1 (40) | Polymer B1 (40) | PAG-1 (3) | Base-1 (2.5) | Polymer A1 (3) | — | PGMEA (1,000) | EL (2,300) | — |
|  | 9 | Polymer P1 (40) | Polymer B1 (40) | PAG-1 (3) | Base-2 (5.0) | Polymer A1 (3) | — | PGMEA (1,000) | EL (1,000) | PGME (1,300) |
|  | 10 | — | Polymer B1 (80) | PAG-1 (8) | Base-1 (2.5) | Polymer A1 (3) | — | PGMEA (1,000) | EL (2,300) | — |
|  | 11 | — | Polymer B2 (80) | PAG-1(8) PAG-2(2) | Base-1 (2.5) | Polymer A1 (3) | TMGU (8) | PGMEA (1,000) | EL (2,300) | — |
|  | 12 | — | Polymer B2 (80) | PAG-1 (8) | Base-2 (5.0) | Polymer A1 (3) | TMGU (8) | PGMEA (1,000) | EL (2,300) | — |
|  | 13 | Polymer P1 (40) | Polymer B1 (40) | — | Base-1 (2.5) | Polymer A1 (3) | — | PGMEA (1,000) | EL (2,300) | — |
|  | 14 | Polymer P1 (40) | Polymer B1 (40) | — | Base-2 (5.0) | Polymer A1 (3) | — | PGMEA (1,000) | EL (1,000) | PGME (1,300) |
|  | 15 | — | Polymer B1 (80) | PAG-1 (8) | Base-1 (2.5) | Polymer A2 (5) | — | PGMEA (1,000) | EL (2,300) | — |
|  | 16 | — | Polymer B1 (80) | PAG-1 (8) | Base-1 (2.5) | Polymer A3 (5) | — | PGMEA (1,000) | EL (2,300) | — |
|  | 17 | Polymer P1 (40) | Polymer B1 (40) | PAG-1 (3) | Base-1 (2.5) | Polymer A1 (3) | — | PGMEA (1,000) | EL (2,300) | — |
|  | 18 | Polymer P1 (40) | Polymer B1 (40) | PAG-1 (3) | Base-2 (5.0) | Polymer A1 (3) | — | PGMEA (1,000) | EL (1,000) | PGME (1,300) |
| Reference Preparation Example | 1 | — | Polymer B1 (80) | PAG-1 (8) | Base-1 (2.5) | — | — | PGMEA (1,000) | EL (2,300) | — |
|  | 2 | — | Polymer B2 (80) | PAG-1(8) PAG-2(2) | Base-1 (2.5) | — | TMGU (8) | PGMEA (1,000) | EL (2,300) | — |
|  | 3 | Polymer P1 (40) | Polymer B1 (40) | PAG-1 (3) | Base-1 (2.5) | — | — | PGMEA (1,000) | EL (2,300) | — |
|  | 4 | Polymer P1 (40) | Polymer B1 (40) | PAG-1 (3) | Base-2 (5.0) | — | — | PGMEA (1,000) | EL (1,000) | PGME (1,300) |
| Comparative Preparation Example | 1 | — | Polymer B1 (80) | PAG-1 (8) | Base-1 (2.5) | Comparative Polymer A4 (3) | — | PGMEA (1,000) | EL (2,300) | — |
|  | 2 | — | Polymer B2 (80) | PAG-1(8) PAG-2(2) | Base-1 (2.5) | Comparative Polymer A4 (3) | TMGU (8) | PGMEA (1,000) | EL (2,300) | — |
|  | 3 | Polymer P1 (40) | Polymer B1 (40) | PAG-1 (3) | Base-2 (5.0) | Comparative Polymer A4 (3) | — | PGMEA (1,000) | EL (1,000) | PGME (1,300) |
|  | 4 | — | Polymer B1 (80) | PAG-1 (8) | Base-1 (2.5) | Comparative Polymer A5 (3) | — | PGMEA (1,000) | EL (2,300) | — |
|  | 5 | — | Polymer B2 (80) | PAG-1(8) PAG-2(2) | Base-1 (2.5) | Comparative Polymer A5 (3) | TMGU (8) | PGMEA (1,000) | EL (2,300) | — |
|  | 6 | Polymer P1 (40) | Polymer B1 (40) | PAG-1 (3) | Base-2 (5.0) | Comparative Polymer A5 (3) | — | PGMEA (1,000) | EL (1,000) | PGME (1,300) |
|  | 7 | — | Polymer B1 (80) | PAG-1 (8) | Base-1 (2.5) | — | — | PGMEA (1,000) | EL (2,300) | — |
|  | 8 | — | Polymer B2 (80) | PAG-1(8) PAG-2(2) | Base-1 (2.5) | — | TMGU (8) | PGMEA (1,000) | EL (2,300) | — |
|  | 9 | Polymer P1 (40) | Polymer B1 (40) | PAG-1 (3) | Base-2 (5.0) | — | — | PGMEA (1,000) | EL (1,000) | PGME (1,300) |

Examples 1 to 9, Reference Examples 1 to 4

[EB Writing Test]

Using a coater/developer system ACT-M (Tokyo Electron Ltd.), each of the resist compositions (Preparation Examples 1 to 9 and Reference Preparation Examples 1 to 4) was spin coated on a photomask blank of 152 mm squares having a chromium oxynitride film at the outermost surface and prebaked on a hot plate at 90° C. for 600 seconds to form a resist film of 80 nm thick. The thickness of the resist film was measured by an optical film thickness measurement system Nanospec (Nanometrics Inc.). Measurement was made at 81 points in the plane of the blank substrate excluding a peripheral band extending 10 mm inward from the blank periphery, and an average film thickness and a film thickness range were computed therefrom.

The coated mask blanks were exposed to electron beam using an EB writer system EBM-5000Plus (NuFlare Technology Inc., accelerating voltage 50 keV), then baked (PEB) at 90° C. for 600 seconds, and developed in a 2.38 wt % tetramethylammonium hydroxide (TMAH) aqueous solution, thereby yielding negative patterns.

The patterned photomask blank was observed under a top-down scanning electron microscope (TDSEM). The optimum exposure (Eop) was defined as the exposure dose ($\mu C/cm^2$) which provided a 1:1 resolution at the top and bottom of a 400-nm 1:1 line-and-space pattern. The maximum resolution of the resist was defined as the minimum line width of a line-and-space pattern that could be resolved at the optimum exposure. The results are shown in Table 2.

TABLE 2

|  |  | Optimum dose ($\mu C/cm^2$) | Maximum resolution (nm) |
|---|---|---|---|
| Example | 1 | 50.0 | 45 |
|  | 2 | 51.2 | 45 |
|  | 3 | 50.5 | 45 |
|  | 4 | 51.1 | 40 |
|  | 5 | 50.7 | 40 |
|  | 6 | 50.8 | 40 |
|  | 7 | 50.9 | 45 |
|  | 8 | 50.8 | 40 |
|  | 9 | 50.1 | 40 |
| Reference Example | 1 | 51.1 | 45 |
|  | 2 | 50.7 | 45 |
|  | 3 | 50.4 | 40 |
|  | 4 | 50.0 | 40 |

No substantial difference in resolution was found between Examples 1 to 9 using the resist compositions containing the fluorinated resin (Preparation Examples 1 to 9) and Reference Examples 1 to 4 using the resist compositions not containing the fluorinated resin (Reference Preparation Examples 1 to 4). It is demonstrated that the fluorinated resin does not adversely affect resolution.

Examples 10 to 21, Comparative Examples 1 to 9

[Evaluation of Antistatic Film Receptivity]
Each of the resist compositions (Preparation Examples 10 to 18 and Comparative Preparation Examples 1 to 9) was coated on a photomask blank to form a resist film under the same conditions as above. Using a coater/developer system ACT-M (Tokyo Electron Ltd.), an electroconductive polymer composition was spin coated over the resist film and baked on a hot plate at 90° C. for 600 seconds to form an antistatic film of 60 nm thick. The electroconductive polymer composition used was a water dispersion of polystyrene-doped polyaniline as described in Proc. SPIE Vol. 8522, 852200-1. Examples 19 to 21 corresponded to the conductive polymer compositions of Examples 10, 11, and 17 to which 0.28 wt % of amino acid, L-(+)-lysine was added. It was examined whether or not the antistatic film was effectively formed, with the results shown in Table 3. The sample was rated good (○) when the antistatic film was effectively formed and NG (x) when the antistatic film could not be formed.

TABLE 3

|  |  | Antistatic film receptivity |
|---|---|---|
| Example | 10 | ○ |
|  | 11 | ○ |
|  | 12 | ○ |
|  | 13 | ○ |
|  | 14 | ○ |
|  | 15 | ○ |
|  | 16 | ○ |
|  | 17 | ○ |
|  | 18 | ○ |

TABLE 3-continued

|  |  | Antistatic film receptivity |
|---|---|---|
|  | 19 | ○ |
|  | 20 | ○ |
|  | 21 | ○ |
| Comparative Example | 1 | X |
|  | 2 | X |
|  | 3 | X |
|  | 4 | X |
|  | 5 | X |
|  | 6 | X |
|  | 7 | ○ |
|  | 8 | ○ |
|  | 9 | ○ |

The resist films containing Polymers A1 to A3 (Examples) are fully receptive to formation of an antistatic film thereon. On the other hand, the resist films containing Comparative Polymers A4 and A5 (Comparative Examples 1 to 6) are not receptive to formation of an antistatic film. In these Comparative Examples, the aqueous antistatic film-forming composition could not be effectively coated probably because fluorine atoms in the fluorinated polymer exerted water repellency. In contrast, the resist films of Examples use the polymers which contain not only fluorine atoms, but also phenolic hydroxyl group-bearing units, and therefore have improved affinity to the aqueous antistatic film-forming composition, allowing a satisfactory antistatic film to be formed.

[EB Writing Test]
The photomask blanks having an antistatic film formed on a resist film as prepared in the evaluation of antistatic film receptivity (Examples 10 to 21 and Comparative Examples 7 to 9) were exposed to electron beam using an EB writer system EBM-5000Plus (NuFlare Technology Inc., accelerating voltage 50 keV), then baked (PEB) at 90° C. for 600 seconds, and developed in a 2.38 wt % TMAH aqueous solution, thereby yielding negative patterns. The resist patterns were evaluated by the following tests. It is noted that the resist patterns resulting from the resist films of Examples 1, 2 and 9, which were not provided with an antistatic film, were also evaluated.

Optimum Dose and Maximum Resolution
These items were evaluated as in Examples 1 to 9.
Surface Resistivity
The surface resistivity of resist film and antistatic film was measured by a resistivity meter Hiresta-UP MCP-HT450 (Mitsubishi Chemical Analytech Co., Ltd.).
Sensitivity Change
The sensitivity of Examples 1 to 9 was compared with the sensitivity of Examples 10 to 18 (corresponding to Examples 1 to 9 plus antistatic film) and Examples 19 to 21 (corresponding to Examples 10, 11 and 17 to which 0.28 wt % of amino acid, L-(+)-lysine was added), from which a deviation (%) was computed. Also, the sensitivity of Examples 1, 2 and 9 was compared with the sensitivity of Comparative Examples 7 to 9, from which a deviation (%) was computed.

Pattern Profile

The resist pattern was cut before a SEM image of the section was visually observed.

PCD

The photomask blank was aged for 2 weeks from formation of an antistatic film, before it was exposed in the same dose as the dose of exposure provided immediately after formation of an antistatic film so as to resolve a 400-nm line-and-space pattern. A line width was measured, and a difference from the initial line width was computed. A change of line width per day is expressed as post-coating delay (PCD). A smaller value of PCD indicates that the resist film is more stable against changes with time after formation of antistatic film.

The test results are reported in Table 4.

TABLE 4

|  |  | Optimum dose ($\mu C/cm^2$) | Maximum resolution (nm) | Surface resistivity ($\Omega/\square$) | Sensitivity change (%) | Pattern profile | PCD (nm/day) |
|---|---|---|---|---|---|---|---|
| Example | 10 | 49.5 | 45 | $3.5 \times 10^8$ | −1.00 | rectangular | 0.07 |
|  | 11 | 50.9 | 45 | $3.2 \times 10^8$ | −0.59 | rectangular | 0.08 |
|  | 12 | 50.1 | 45 | $3.1 \times 10^8$ | −0.79 | rectangular | 0.08 |
|  | 13 | 50.4 | 40 | $3.3 \times 10^8$ | −1.37 | rectangular | 0.07 |
|  | 14 | 50.2 | 40 | $2.8 \times 10^8$ | −0.99 | rectangular | 0.08 |
|  | 15 | 50.1 | 40 | $2.9 \times 10^8$ | −1.38 | rectangular | 0.08 |
|  | 16 | 50.4 | 45 | $3.1 \times 10^8$ | −0.98 | rectangular | 0.07 |
|  | 17 | 50.3 | 40 | $2.9 \times 10^8$ | −0.98 | rectangular | 0.08 |
|  | 18 | 49.5 | 40 | $2.7 \times 10^8$ | −1.20 | rectangular | 0.08 |
|  | 19 | 49.5 | 45 | $5.0 \times 10^8$ | −0.80 | rectangular | 0.07 |
|  | 20 | 50.9 | 45 | $4.8 \times 10^8$ | −0.59 | rectangular | 0.07 |
|  | 21 | 50.4 | 40 | $4.2 \times 10^8$ | −0.79 | rectangular | 0.07 |
| Comparative Example | 7 | 45.0 | 45 | $3.6 \times 10^8$ | −10.00 | inversely tapered | 0.29 |
|  | 8 | 45.2 | 45 | $3.2 \times 10^8$ | −11.72 | inversely tapered | 0.34 |
|  | 9 | 46.0 | 40 | $3.3 \times 10^8$ | −9.27 | inversely tapered | 0.28 |
| Example | 1 | 50.0 | 45 | outside measurement range | — | rectangular | 0.07 |
|  | 2 | 51.2 | 45 | outside measurement range | — | rectangular | 0.07 |
|  | 9 | 50.7 | 40 | outside measurement range | — | rectangular | 0.07 |

1 cm squares, and developed. The resist film was rated OK when a space of 1 μm squares was formed, and NG when not formed. The results are shown in Table 5.

TABLE 5

|  |  | Chemical flare resistance (formation of 1-μm square space at the center) |
|---|---|---|
| Example | 1 | OK |
|  | 2 | OK |
|  | 8 | OK |
| Reference Example | 1 | NG (not formed because of negative working) |
|  | 2 | NG (not formed because of negetive working) |
|  | 3 | NG (not formed because of negative working) |

In the resist films of Examples 10 to 21 having antistatic film formed thereon, patterns could be formed at a high accuracy of writing position due to their low surface resistivity. In the resist films of Examples 1, 2 and 9 having no antistatic film formed thereon, resolution and pattern profile were satisfactory, but the accuracy of writing position was inferior to that of Examples 10 to 21 due to their high surface resistivity.

The resist compositions not containing fluorinated resin (Comparative Examples 7 to 9) showed inferior pattern profile and PCD. The degradation of performance observed in these Comparative Examples was not observed in Examples 10 to 21. It is believed that disadvantages of Comparative Examples are the result of the acid penetrating from the antistatic film into the resist film whereas advantages of Examples are the result of the fluorinated resin preventing the acid from penetrating from the antistatic film into the resist film.

[Chemical Flare Resistance Test]

A resist film was formed under the same conditions as in the EB writing test, exposed in a setup designed to form a space of 1 μm squares at the center of a negative pattern of In the resist compositions not containing fluorinated resin of Reference Examples 1 to 3, the pattern at the center could not be formed because of the chemical flare phenomenon that the acid component volatilizes from the resist film surface and re-deposits on the unexposed region. In Examples 1, 2 and 8, the pattern at the center could be formed as designed. It is believed that this is because the fluorinated resin segregates on top of the resist film and serves to suppress chemical flare and control the negative working.

[Evaluation of Development Residue]

A resist film was formed under the same conditions as in the EB writing test, directly (i.e., without exposure) baked at 120° C. for 600 seconds, and developed in a 2.38 wt % TMAH aqueous solution. Using a mask defect monitor M2351 (Lasertec Corp.), development residues were counted. The total count of defects after development is reported in Table 6.

TABLE 6

| Example | | Total count of defects after development |
|---|---|---|
| Example | 1 | 120 |
|  | 2 | 210 |
|  | 3 | 260 |
|  | 4 | 80 |
|  | 5 | 50 |
|  | 6 | 110 |
|  | 7 | 120 |
|  | 8 | 80 |
|  | 9 | 90 |
| Reference Example | 1 | 530 |
|  | 2 | 710 |
|  | 3 | 450 |
|  | 4 | 480 |

In the resist compositions not containing fluorinated resin of Reference Examples 1 to 4, negative working reaction took place to some extent during the bake, which revealed itself as development residues. In Examples 1 to 9, the count of development residues was relatively small. This is presumably because the fluorinated resin is of such nature that it may be readily dissolved in the developer and ensures that the defect-forming products resulting from negative working are dissolved away together.

Japanese Patent Application No. 2015-078459 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank comprising a chemically amplified negative resist film adapted for exposure to high-energy radiation and an antistatic film on the resist film, said resist film comprising
   (A) a polymer comprising recurring units represented by the general formula (1) and recurring units having at least one fluorine atom,
   (B) a base resin adapted to reduce its solubility in alkaline developer under the action of acid,
   (C) an acid generator, and
   (D) a basic compound,

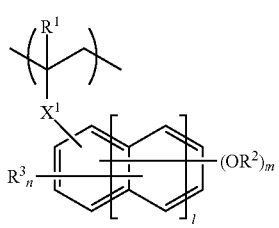

(1)

wherein $R^1$ is hydrogen or methyl, $R^2$ is hydrogen or a straight or branched $C_1$-$C_5$ monovalent hydrocarbon group in which at least one of carbon-bonded hydrogen atoms may be substituted by hydroxyl, or in which a heteroatom selected from oxygen, sulfur and nitrogen may intervene in a carbon-carbon bond, $R^3$ is a straight or branched $C_1$-$C_5$ monovalent hydrocarbon group in which at least one of carbon-bonded hydrogen atoms may be substituted by hydroxyl, or in which a heteroatom selected from oxygen, sulfur and nitrogen may intervene in a carbon-carbon bond, m is an integer of 1 to 3, n is an integer satisfying $0 \leq n \leq 5+2l-m$, $l$ is 0 or 1, and $X^1$ is a single bond, —C(=O)O— or —C(=O)NH—, wherein the recurring units having at least one fluorine atom are units of at least one type selected from units having the general formulae (2) to (7):

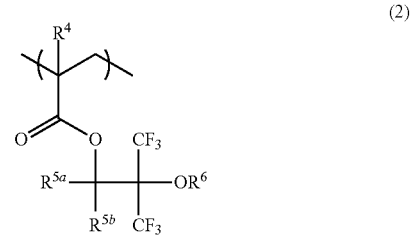

(2)

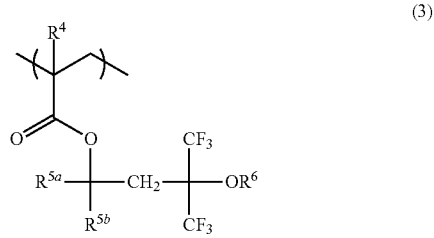

(3)

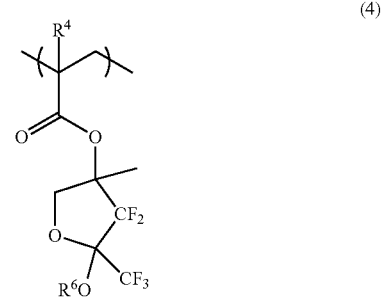

(4)

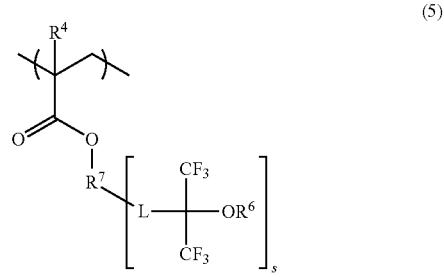

(5)

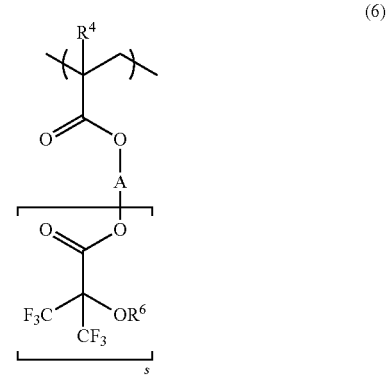

(6)

(7)

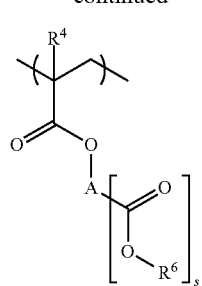

wherein $R^4$ is each independently hydrogen, fluorine, methyl or trifluoromethyl, $R^{5a}$ and $R^{5b}$ are each independently hydrogen or a straight, branched or cyclic $C_1$-$C_{10}$ alkyl group, $R^6$ is each independently hydrogen, a straight, branched or cyclic $C_1$-$C_{15}$ monovalent hydrocarbon or fluorinated hydrocarbon group, or an acid labile group, with the proviso that in the monovalent hydrocarbon or fluorinated hydrocarbon group represented by $R^6$, an ether bond (—O—) or carbonyl moiety (—C(=O)—) may intervene in a carbon-carbon bond, $R^7$ is a (s+1)-valent, cyclic $C_3$-$C_{20}$ hydrocarbon or fluorinated hydrocarbon group, L is a single bond or an optionally substituted divalent linking group, A is each independently a (s+1)-valent, straight, branched or cyclic $C_1$-$C_{20}$ hydrocarbon or fluorinated hydrocarbon group, with the proviso that at least one of $R^6$ and A in formula (7) contains fluorine, and s is an integer of 1 to 3.

2. The photomask blank of claim 1 wherein the base resin (B) comprises recurring units of at least one type selected from sulfonium salt units having the general formulae (a1), (a2), and (a3):

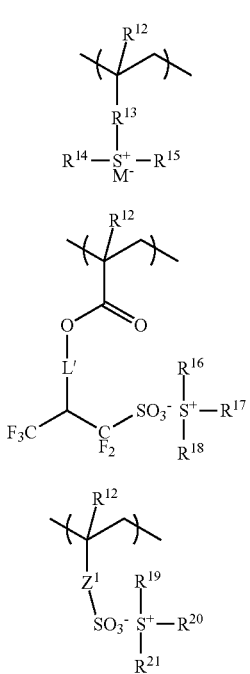

wherein $R^{12}$ is each independently hydrogen or methyl, $R^{13}$ is a single bond, phenylene group, —O—$R^{22}$—, or —C(=O)—$Z^2$—$R^{22}$—, $Z^2$ is oxygen or NH, $R^{22}$ is a straight, branched or cyclic $C_1$-$C_6$ alkylene, alkenylene or phenylene group which may contain a carbonyl (—CO—), ester (—COO—), ether (—O—) or hydroxyl moiety, $L^1$ is a single bond or —$Z^3$—C(=O)—O—, $Z^3$ is a straight, branched or cyclic $C_1$-$C_{20}$ divalent hydrocarbon group which may be substituted with a heteroatom, $Z^1$ is a single bond, methylene, ethylene, phenylene, fluorinated phenylene, —O—$R^{23}$—, or —C(=O)—$Z^4$—$R^{23}$—, $Z^4$ is oxygen or NH, $R^{23}$ is a straight, branched or cyclic $C_1$-$C_6$ alkylene, alkenylene or phenylene group which may contain a carbonyl, ester, ether or hydroxyl moiety, $M^-$ is a non-nucleophilic counter ion $R^{14}$, $R^{15}$, $R^{16}$, $R^{17}$, $R^{18}$, $R^{19}$, $R^{20}$, and $R^{21}$ are each independently a straight $C_1$-$C_{20}$, branched or cyclic $C_3$-$C_{20}$ monovalent hydrocarbon group in which at least one hydrogen atom may be replaced by a heteroatom selected from oxygen, sulfur, nitrogen and halogen, or in which a heteroatom selected from oxygen, sulfur and nitrogen may intervene, so that a hydroxyl group, cyano group, carbonyl group, ether bond, ester bond, sulfonic acid ester bond, carbonate bond, lactone ring, sultone ring, carboxylic anhydride, or haloalkyl group may form or intervene, or $R^{14}$ and $R^{15}$ may bond together to form a ring with the sulfur atom, or any two or more of $R^{16}$, $R^{17}$ and $R^{18}$ or any two or more of $R^{19}$, $R^{20}$ and $R^{21}$ may bond together to form a ring with the sulfur atom.

3. The photomask blank of claim 1 wherein the base resin (B) comprises recurring units having the general formula (UN-1):

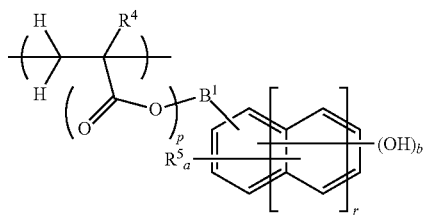

wherein $R^4$ is hydrogen, fluorine, methyl or trifluoromethyl, $R^5$ is each independently hydrogen or a $C_1$-$C_6$ alkyl group, $B^1$ is a single bond or a $C_1$-$C_{10}$ alkylene group which may contain an ether bond, p is 0 or 1, r is an integer of 0 to 2, a is an integer satisfying a≤5+2r−b, and b is an integer of 1 to 5.

4. The photomask blank of claim 1 wherein the base resin (B) comprises recurring units of at least one type selected from units having the general formulae (UN-2) and (UN-3):

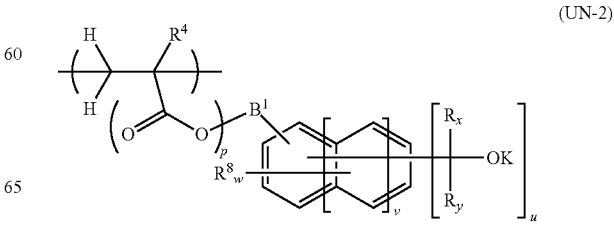

-continued

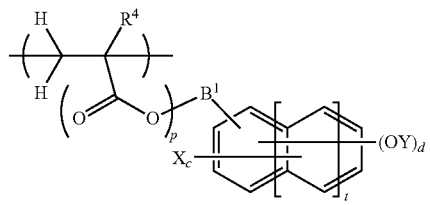
(UN-3)

wherein p is each independently 0 or 1, $R^4$ is each independently hydrogen, fluorine, methyl or trifluoromethyl, $B^1$ is each independently a single bond or a $C_1$-$C_{10}$ alkylene group which may contain an ether bond, $R^8$ is hydrogen, halogen, an optionally halo-substituted, straight, branched or cyclic $C_2$-$C_8$ acyloxy group, an optionally halo-substituted, straight, branched or cyclic $C_1$-$C_6$ alkyl group, or an optionally halo-substituted, straight, branched or cyclic $C_1$-$C_6$ alkoxy group, K is hydrogen, a straight, branched or cyclic $C_1$-$C_{10}$ monovalent aliphatic hydrocarbon group which may contain an ethereal oxygen atom, carbonyl moiety or carbonyloxy moiety at an intermediate of its chain, or an optionally substituted monovalent aromatic group, Rx and Ry are each independently hydrogen, a $C_1$-$C_{15}$ alkyl group which may be substituted with hydroxyl or alkoxy, or an optionally substituted monovalent aromatic group, Rx and Ry may bond together to form a ring with the carbon atom to which they are attached, excluding that Rx and Ry are hydrogen at the same time, u is an integer of 1 to 3, v is an integer of 0 to 2, w is an integer satisfying w≤5+2v−u, X is hydrogen, a substituted or unsubstituted, straight, branched or cyclic $C_1$-$C_{20}$ alkyl group, $C_2$-$C_{20}$ alkylthioalkyl group, halogen, nitro, cyano, sulfinyl, or sulfonyl group, Y is a $C_{20}$ alkyl group or $C_1$-$C_{20}$ acyl group, d is an integer of 0 to 5, t is an integer of 0 to 2, and c is an integer satisfying c≤5+2t−d.

5. The photomask blank of claim 1 wherein the base resin (B) comprises recurring units of at least one type selected from units having the general formulae (UN-4) and (UN-5):

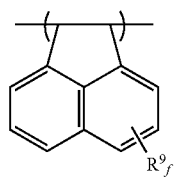
(UN-4)

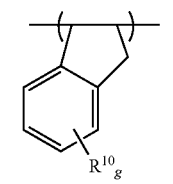
(UN-5)

wherein $R^9$ is hydrogen, an optionally halo-substituted $C_1$-$C_6$ alkyl group or primary or secondary alkoxy group, or an optionally halo-substituted $C_2$-$C_7$ alkylcarbonyloxy group, f is an integer of 0 to 6, $R^{10}$ is hydrogen, an optionally halo-substituted $C_1$-$C_6$ alkyl group or primary or secondary alkoxy group, or an optionally halo-substituted $C_2$-$C_7$ alkylcarbonyloxy group, and g is an integer of 0 to 4.

6. The photomask blank of claim 1 wherein the antistatic film comprises an amino acid.

7. The photomask blank of claim 6 wherein the amino acid has the general formula (8):

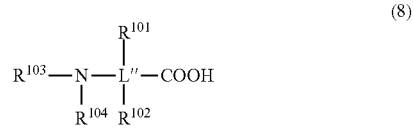
(8)

wherein $R^{101}$ and $R^{102}$ are each independently hydrogen or a straight, branched or cyclic $C_1$-$C_{20}$ monovalent hydrocarbon group which may be separated by a heteroatom, $R^{103}$ and $R^{104}$ are each independently hydrogen or a straight, branched or cyclic $C_1$-$C_{20}$ monovalent hydrocarbon group which may be separated by a heteroatom, or a pair of $R^{101}$ and $R^{103}$ or $R^{101}$ and $R^{104}$ may bond together to form a ring with the carbon and nitrogen atoms to which they are attached, and L″ is a straight, branched or cyclic $C_1$-$C_{20}$ divalent hydrocarbon group which may be separated by a heteroatom.

8. The photomask blank of claim 1 wherein the resist film further comprises a crosslinker.

9. The photomask blank of claim 1 wherein the resist film is to be exposed patternwise by EB lithography.

10. A pattern forming process comprising the steps of:
exposing the resist film of the photomask blank of claim 1 to high-energy radiation without any intervening liquid, and
developing the resist film in an alkaline developer to form a resist pattern.

11. The process of claim 10 wherein the high-energy radiation is an electron beam.

12. A method for preparing a photomask from the photomask blank of claim 1, comprising the steps of: (i) forming a resist pattern on the photomask blank by exposing the resist film of the photomask blank to high-energy radiation without any intervening liquid, and developing the resist film in an alkaline developer to form a resist pattern; and (ii) etching the photomask blank using the resist pattern as etch mask.

13. A photomask blank comprising a chemically amplified negative resist film adapted for exposure to high-energy radiation and an antistatic film on the resist film, said resist film comprising
(A) a polymer comprising recurring units represented by the general formula (1) and recurring units having at least one fluorine atom,
(B) a base resin adapted to reduce its solubility in alkaline developer under the action of acid,
(C') a resin comprising recurring units of at least one type selected from sulfonium salt units having the general formulae (a1), (a2), and (a3), and
(D) a basic compound,

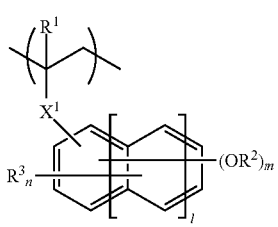
(1)

wherein R¹ is hydrogen or methyl, R² is hydrogen or a straight or branched $C_1$-$C_5$ monovalent hydrocarbon group in which at least one of carbon-bonded hydrogen atoms may be substituted by hydroxyl, or in which a heteroatom selected from oxygen, sulfur and nitrogen may intervene in a carbon-carbon bond, R³ is a straight or branched $C_1$-$C_5$ monovalent hydrocarbon group in which at least one of carbon-bonded hydrogen atoms may be substituted by hydroxyl, or in which a heteroatom selected from oxygen, sulfur and nitrogen may intervene in a carbon-carbon bond, m is an integer of 1 to 3, n is an integer satisfying $0 \leq n \leq 5+2l-m$, l is 0 or 1, and $X^1$ is a single bond, —C(=O)O— or —C(=O)NH—,

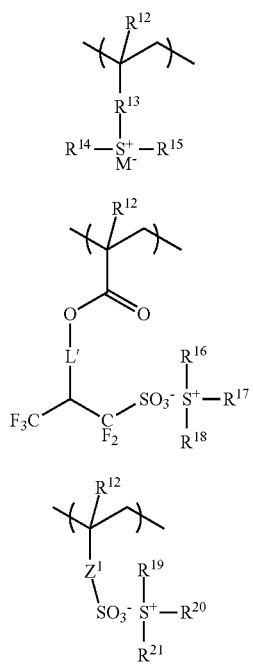

wherein $R^{12}$ is each independently hydrogen or methyl, $R^{13}$ is a single bond, phenylene group, —O—$R^{22}$—, or —C(=O)—$Z^2$—$R^{22}$—, $Z^2$ is oxygen or NH, $R^{22}$ is a straight, branched or cyclic $C_1$-$C_6$ alkylene, alkenylene or phenylene group which may contain a carbonyl (—CO—), ester (—COO—), ether (—O—) or hydroxyl moiety, L' is a single bond or —$Z^3$—C(=O)—O—, $Z^3$ is a straight, branched or cyclic $C_1$-$C_{20}$ divalent hydrocarbon group which may be substituted with a heteroatom, $Z^1$ is a single bond, methylene, ethylene, phenylene, fluorinated phenylene, —O—$R^{23}$—, or —C(=O)—$Z^4$—$R^{23}$—, $Z^4$ is oxygen or NH, $R^{23}$ is a straight, branched or cyclic $C_1$-$C_6$ alkylene, alkenylene or phenylene group which may contain a carbonyl, ester, ether or hydroxyl moiety, $M^-$ is a non-nucleophilic counter ion $R^{14}$, $R^{15}$, $R^{16}$, $R^{17}$, $R^{18}$, $R^{19}$, $R^{20}$, and $R^{21}$ are each independently a straight $C_1$-$C_{20}$, branched or cyclic $C_3$-$C_{20}$ monovalent hydrocarbon group in which at least one hydrogen atom may be replaced by a heteroatom selected from oxygen, sulfur, nitrogen and halogen, or in which a heteroatom selected from oxygen, sulfur and nitrogen may intervene, so that a hydroxyl group, cyano group, carbonyl group, ether bond, ester bond, sulfonic acid ester bond, carbonate bond, lactone ring, sultone ring, carboxylic anhydride, or haloalkyl group may form or intervene, or $R^{14}$ and $R^{15}$ may bond together to form a ring with the sulfur atom, or any two or more of $R^{16}$, $R^{17}$ and $R^{18}$ or any two or more of $R^{19}$, $R^{20}$ and $R^{21}$ may bond together to form a ring with the sulfur atom, wherein the recurring units having at least one fluorine atom are units of at least one type selected from units having the general formulae (2) to (7):

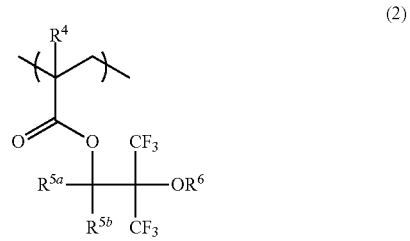

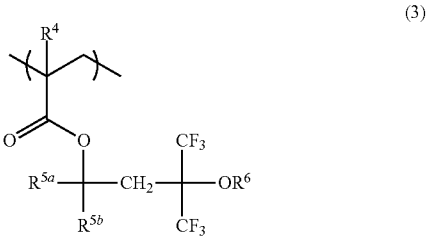

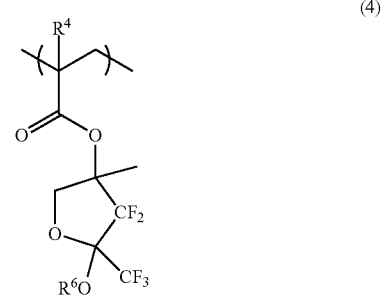

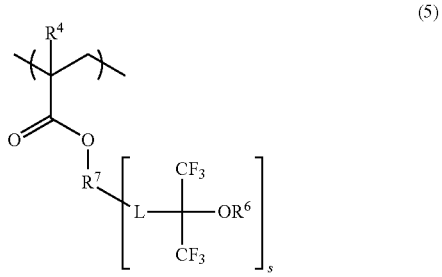

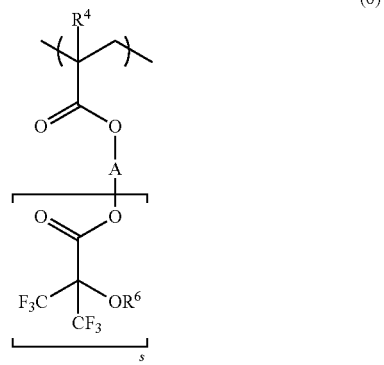

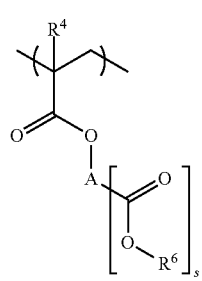

(7)

wherein $R^4$ is each independently hydrogen, fluorine, methyl or trifluoromethyl, $R^{5a}$ and $R^{5b}$ are each independently hydrogen or a straight, branched or cyclic $C_1$-$C_{10}$ alkyl group, $R^6$ is each independently hydrogen, a straight, branched or cyclic $C_1$-$C_{15}$ monovalent hydrocarbon or fluorinated hydrocarbon group, or an acid labile group, with the proviso that in the monovalent hydrocarbon or fluorinated hydrocarbon group represented by $R^6$, an ether bond (—O—) or carbonyl moiety (—C(=O)—) may intervene in a carbon-carbon bond, $R^7$ is a (s+1)-valent, cyclic $C_3$-$C_{20}$ hydrocarbon or fluorinated hydrocarbon group, L is a single bond or an optionally substituted divalent linking group, A is each independently a (s+1)-valent, straight, branched or cyclic $C_1$-$C_{20}$ hydrocarbon or fluorinated hydrocarbon group, with the proviso that at least one of $R^6$ and A in formula (7) contains fluorine, and s is an integer of 1 to 3.

* * * * *